US006815964B2

(12) United States Patent
Di Gregorio et al.

(10) Patent No.: US 6,815,964 B2
(45) Date of Patent: Nov. 9, 2004

(54) TEST BOARD DE-EMBEDDING METHOD TO IMPROVE RF MEASUREMENTS ACCURACY ON AN AUTOMATIC TESTING EQUIPMENT FOR IC WAFERS

(75) Inventors: Giuseppe Di Gregorio, Gravina Di Catania (IT); Maria Luisa Gambina, Catania (IT); Biagio Russo, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 106 days.

(21) Appl. No.: 10/033,364

(22) Filed: Dec. 26, 2001

(65) Prior Publication Data

US 2002/0167304 A1 Nov. 14, 2002

Related U.S. Application Data

(60) Provisional application No. 60/259,346, filed on Dec. 29, 2000.

(51) Int. Cl.$^7$ .............................................. G01R 31/02
(52) U.S. Cl. ...................... 324/758; 324/754; 324/765; 324/158.1
(58) Field of Search .............................. 324/758, 158.1, 324/754, 765, 762, 751, 757; 348/87, 94, 95, 126, 190; 382/144, 151

(56) References Cited

U.S. PATENT DOCUMENTS 6,002,426 A * 12/1999 Back et al. .................... 348/87
6,154,041 A * 11/2000 Cheng ......................... 324/758
6,445,172 B1 * 9/2002 Park et al. ................ 324/158.1

* cited by examiner

Primary Examiner—David A. Zarneke
Assistant Examiner—Jimmy Nguyen
(74) Attorney, Agent, or Firm—Lisa K. Jorgenson; Robert Iannucci; Seed IP Law Group PLLC

(57) ABSTRACT

The present invention relates to method to improve RF measurements accuracy on an automatic testing equipment (ATE) for IC wafers by implementing a test board de-embedding phase, wherein each wafer includes a device under test located on a wafer die plane and being contacted by probecard needles of a probecard that is coupled to a configuration board through a probe interface board (PIB), the method including the following phases: performing an automatic calibration phase of the testing equipment up to an internal plane located inside the automatic testing equipment; performing a calibration plane transfer up to a plane of the configuration board using a predetermined number of calibration standard loads realized on the wafer; performing a test boards de-embedding phase up to the wafer die plane.

25 Claims, 26 Drawing Sheets

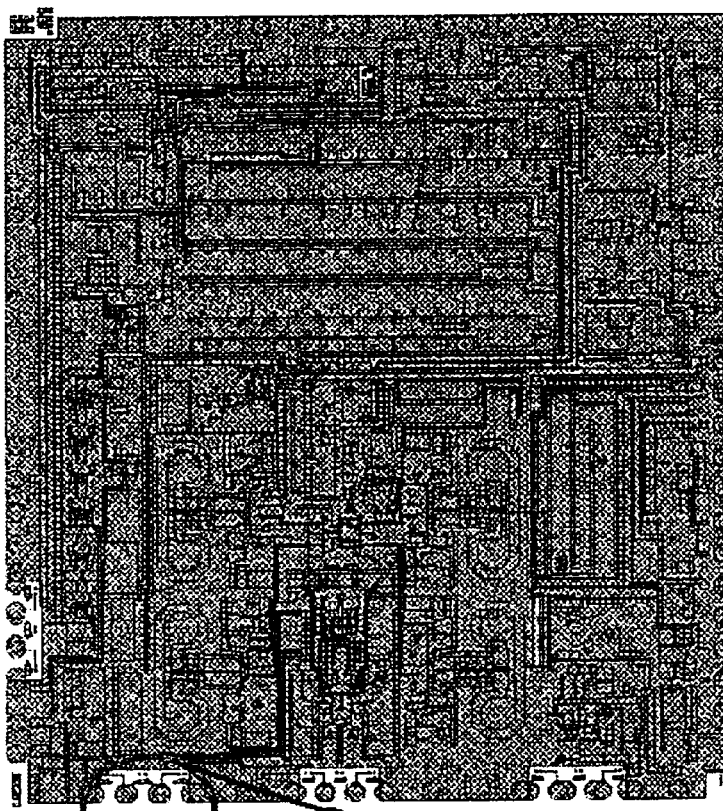
*FIG. 9A*
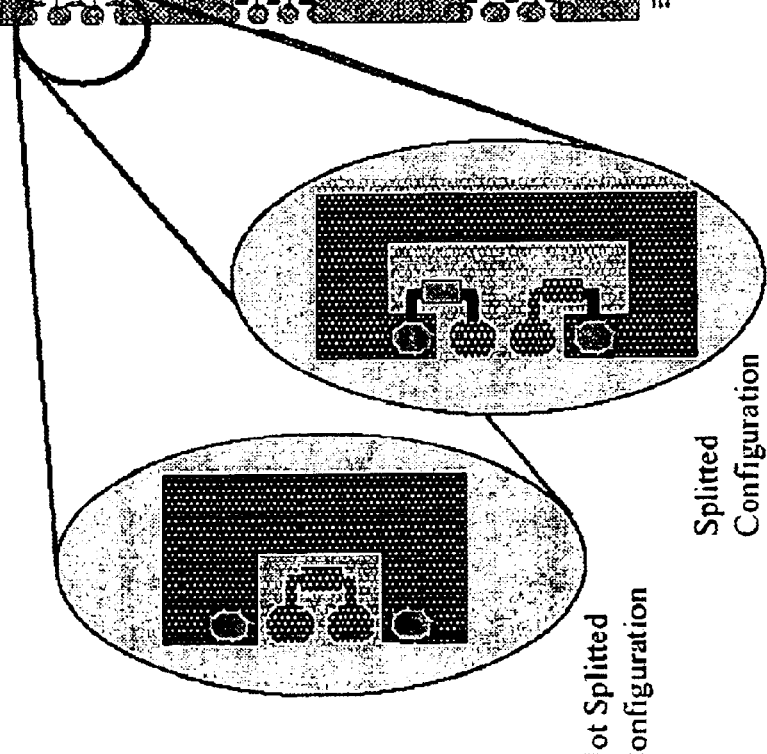
*FIG. 9B*
*FIG. 9C*

TEST BOARD DE-EMBEDDING METHOD TO IMPROVE RF MEASUREMENTS ACCURACY ON AN AUTOMATIC TESTING EQUIPMENT FOR IC WAFERS

BACKGROUND OF THE INVENTION

1. Field of the Invention

The present invention relates to a test board de-embedding method to improve RF measurements accuracy on an automatic testing equipment for IC wafers.

More specifically, the invention relates to a test board de-embedding method to improve RF measurements accuracy on an automatic testing equipment for IC wafers, wherein each wafer includes a device under test located on a wafer die plane and being contacted by probecard needles of a probecard that is coupled to a configuration board through a probe interface board.

2. Description of the Related Art

As is well known in this specific technical field, there is a great need to calibrate an automatic test equipment (ATE) and to de-embed the test boards at wafer level. This is particularly difficult because the connection between a RF tester instrumentation of the ATE and the integrated device or circuit to be tested on the wafer is not direct.

For this reason, the RF measurements are often inaccurate because of the values measured on the bench and the related correlation operations with the bench.

We will also refer hereinafter to the ATE with the brief appellation of "tester".

The IC wafer, in fact, is contacted by a board known as "probecard" that contains the needles ring for the contact. The probecard is coupled to a configuration board through a probe interface board (PIB).

The probecard and the PIB depend on the particular device under test (DUT) while the configuration board doesn't depend on the DUT. Normally, the configuration board is a front end board that allows to setup the ATE in a plurality of configurations or options.

As clearly shown in FIG. 2, the tester includes two microwave ports that are connected to the PIB (Probe In Board) through the configuration board that depends on the particular configuration of the tester.

When an automatic calibration routine is invoked, or a user command "calibrate-uwport" is selected, the RF calibration is performed and the calibration plane is set at an internal plane, inside the ATE.

This means that, in order to have calibrated measurements at the wafer die level, there is a need to extend the calibration plane from the "Internal Plane" to the "Wafer Die Plane". Those planes are clearly shown in FIG. 2.

However, up to now no wafer calibration standards have been provided to allow this kind of calibration. In other words, according to the prior art it is not possible to transfer the calibration plane up to the wafer level.

Typically, at present, two known procedures are used, depending on the environment in which the device under test (DUT) has to be tested.

A first procedure is used in the production environment and implements the following steps:

1. Calibration up to the Configuration-Board Plane;
2. Scalar correction factors evaluation from bench correlation.

A second procedure is used in the development environment and implements the following steps:

1. Calibration up to the Configuration-Board Plane;
2. De-embedding of PIB using coaxial OSP Calibration Standards;
3. Scalar correction factors evaluation from bench correlation.

Both these procedures are affected of the following problems:

the measurement accuracy on ATE is strongly dependent on the bench accuracy;

all the errors, made during the correlation operation, are transferred to the correction factors evaluation;

correction factors depend on the status of the test boards and then they have to be periodically upgraded;

correction factors depend on the status of the tester and then they have to be upgraded each time maintenance actions have made on the tester.

Moreover, the bench correlation action is characterized, normally, by a too big cycle-time:

$$T \geq 20 \text{ days}$$

The aim of the present invention is to provide a technique for calibrating an Automatic Test Equipment (ATE) and for de-embedding the test-boards at wafer level.

A further aim of the present invention is to provide a simple way to design and perform a calibration standards on wafer, in particular for a device under test (DUT).

BRIEF SUMMARY OF THE INVENTION

According to one embodiment of the invention a tester calibration and de-embedding method is provided to improve RF measurements accuracy on an automatic testing equipment for IC wafers by implementing a test board de-embedding phase, wherein each wafer includes a device under test located on a wafer die plane and being contacted by probecard needles of a probecard that is coupled to a configuration board through a probe interface board, the method including the following phases:

performing an automatic calibration phase of said testing equipment up to an internal plane located inside said automatic testing equipment;

performing a calibration plane transfer up to a plane of said configuration board using a predetermined number of calibration standard loads realized on said wafer;

performing a test boards de-embedding phase up to the wafer die plane.

This approach is suitable either in development and production environment and, as will be explained, it avoids performing any correlation actions.

The features and advantages of a method and tester according to the invention will be apparent from the following description of an embodiment thereof, given by way of non-limiting example with reference to the accompanying drawings.

BRIEF DESCRIPTION OF THE SEVERAL VIEWS OF THE DRAWINGS

FIG. 9A is a schematic view of an Integrated Circuit having at least a pad terminal connected to a Load as a calibration standard according to the present invention, FIG. 9B is an enlarged view of the pad terminal in a splitted configureation, and FIG. 9C is an enlarged view of the pad terminal in an unsplitted configuration;

Figure 17:
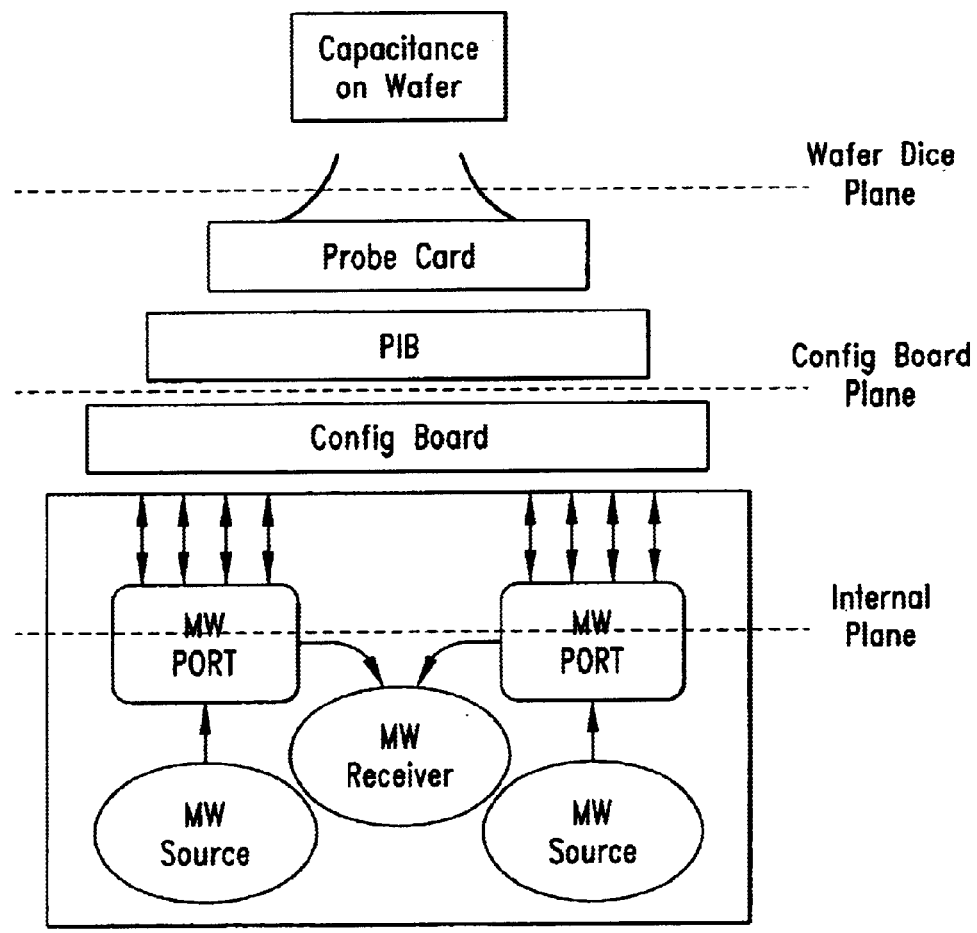
Figure 18:
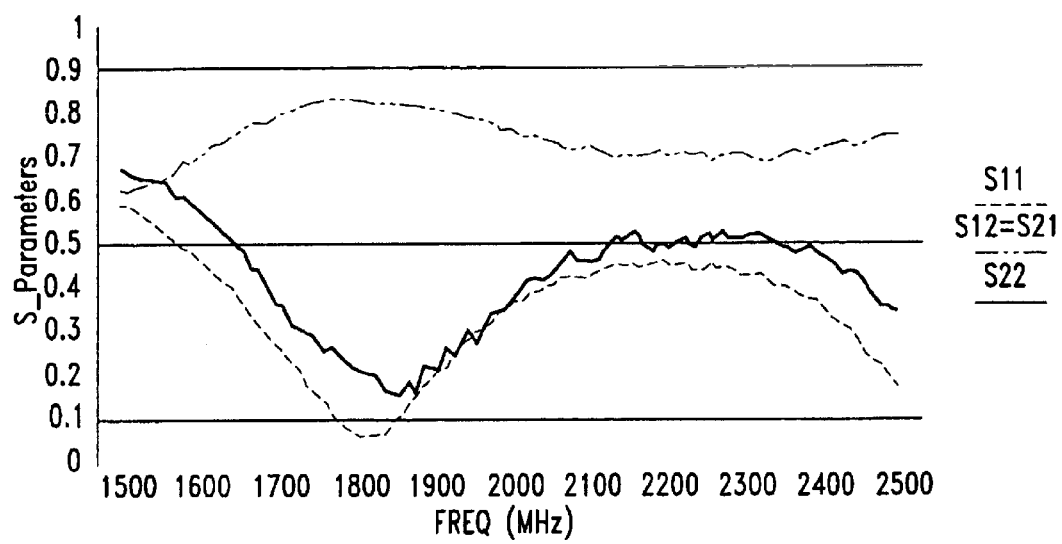
Figure 21:
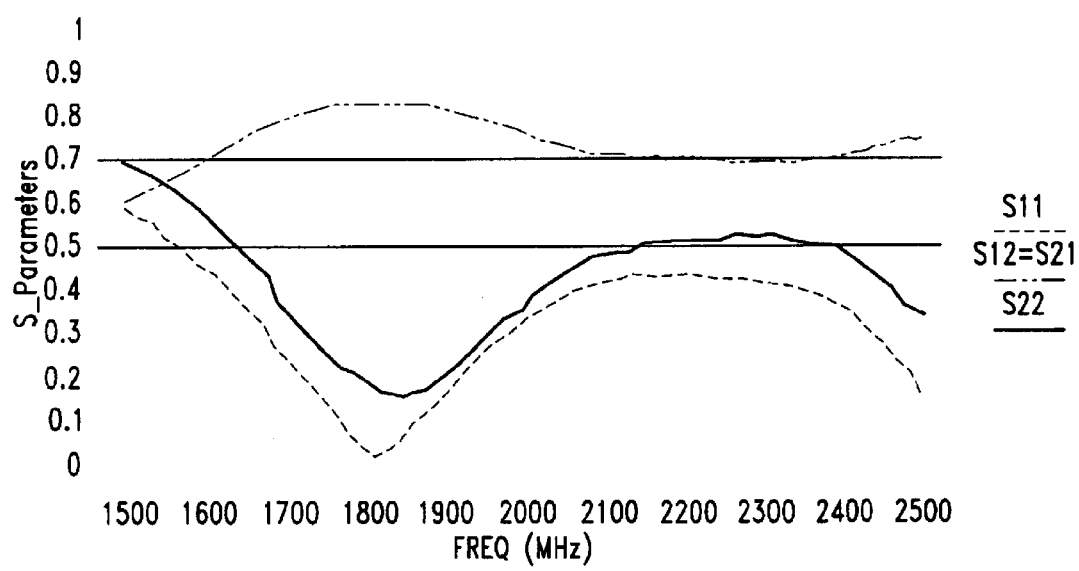
Figure 19:
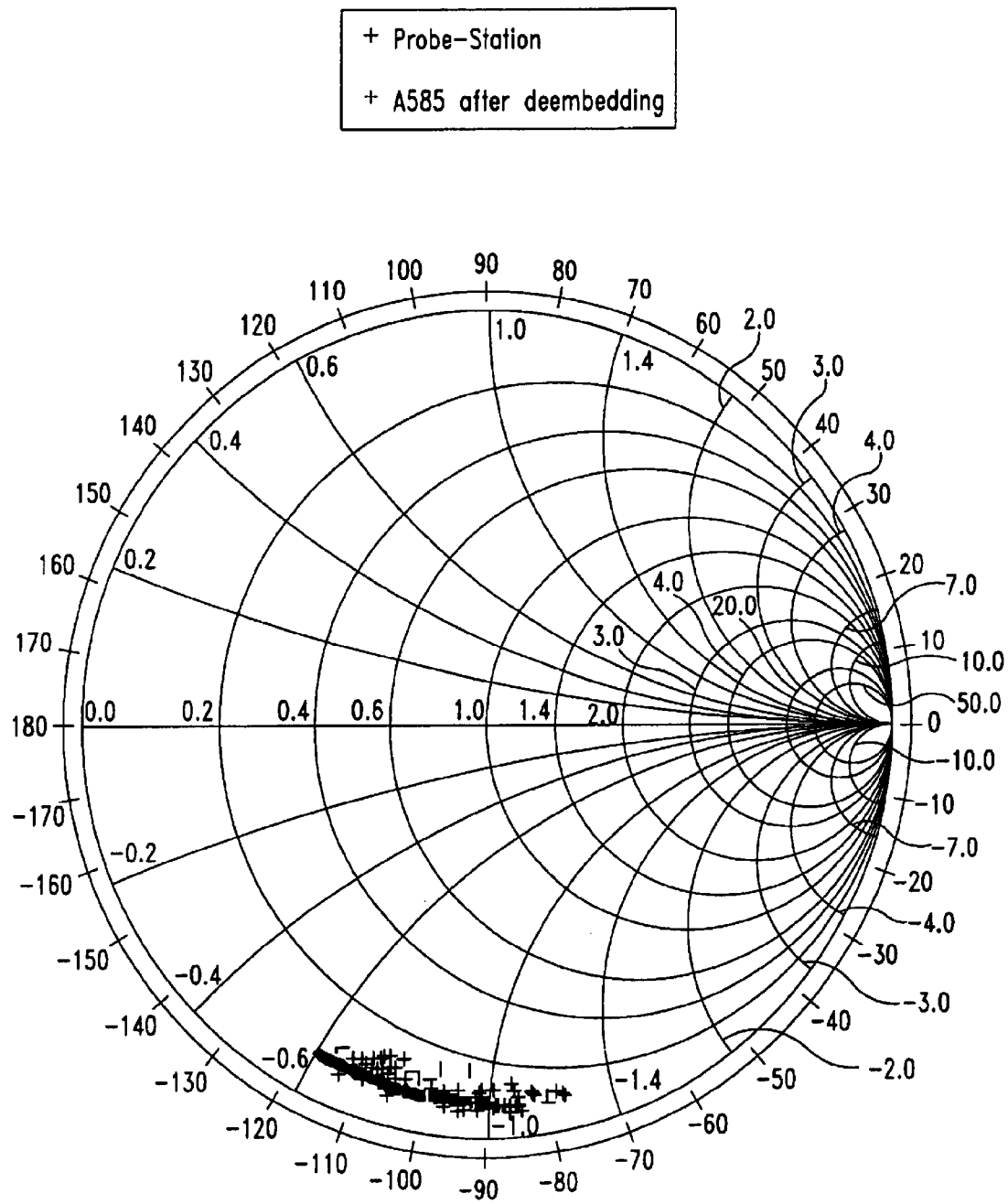
Figure 20:
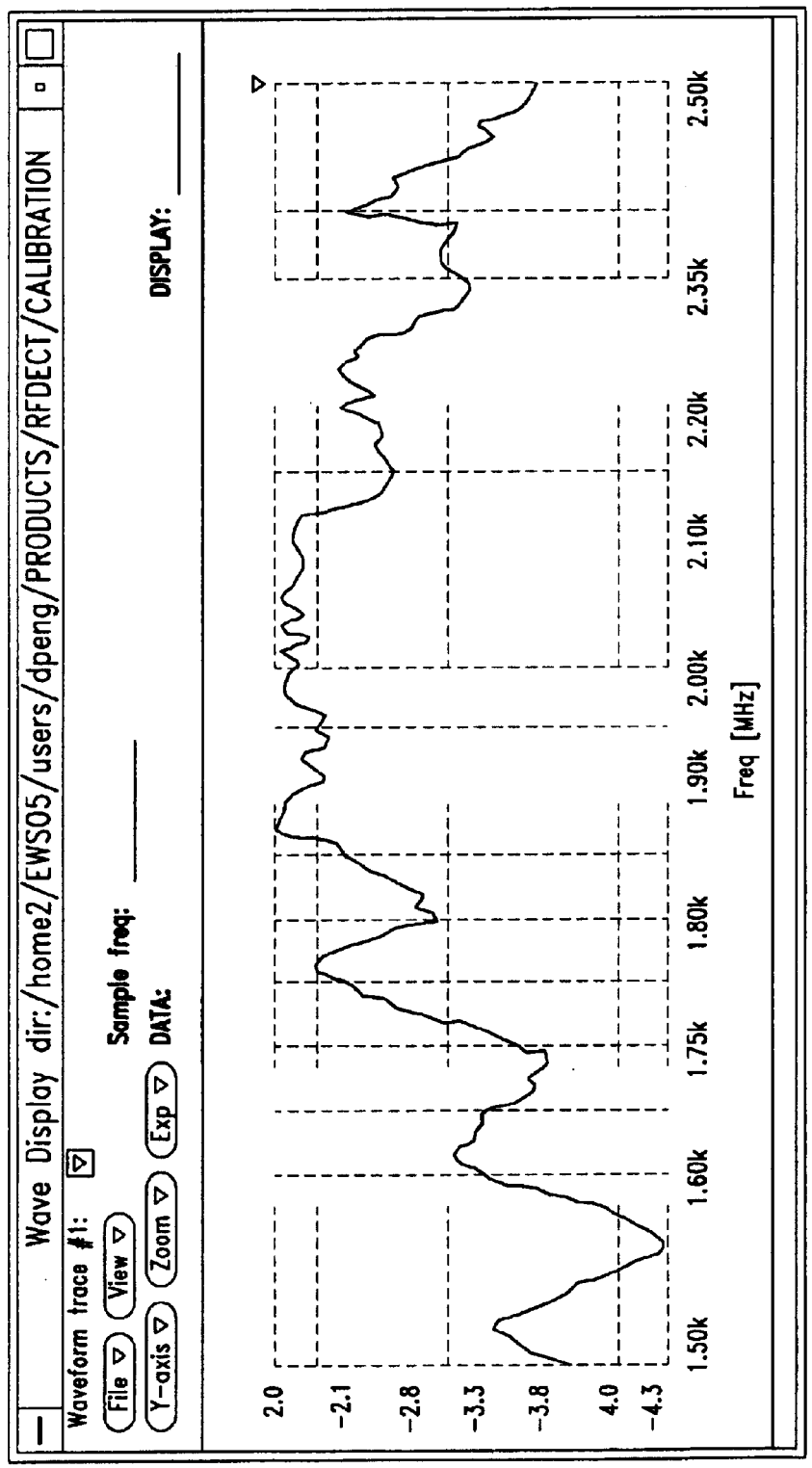
Figure 22:
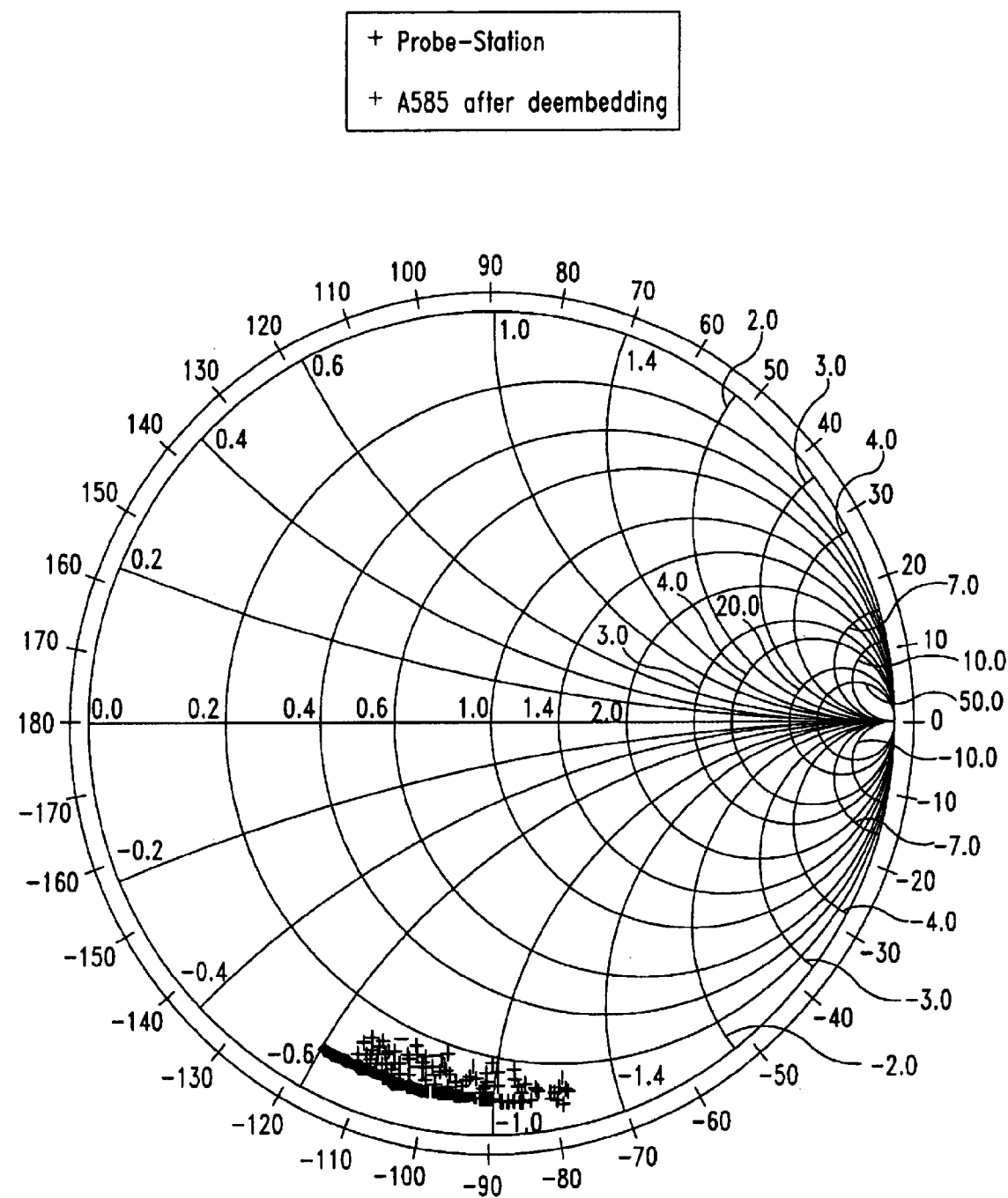
Figure 23:
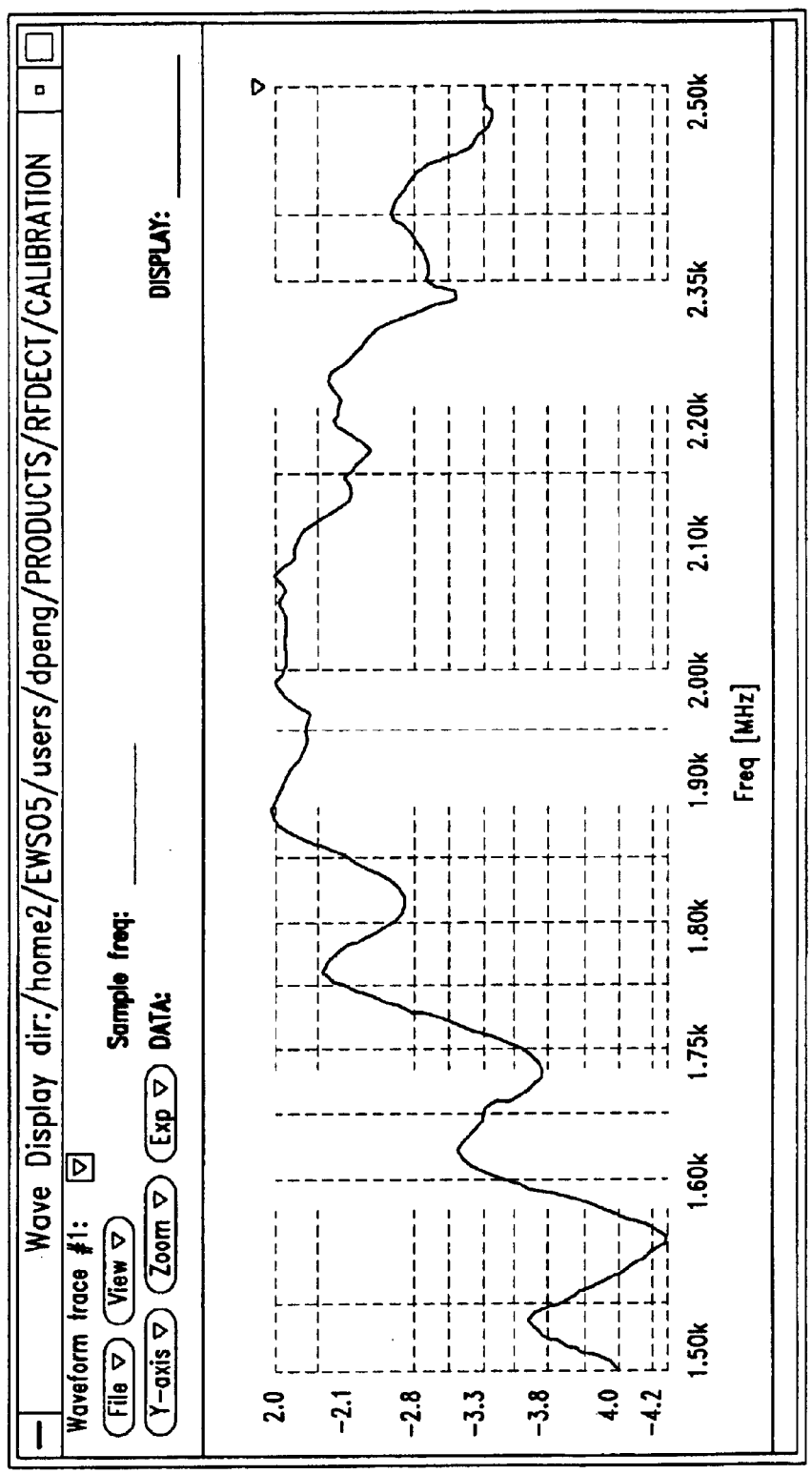
Figure 24:
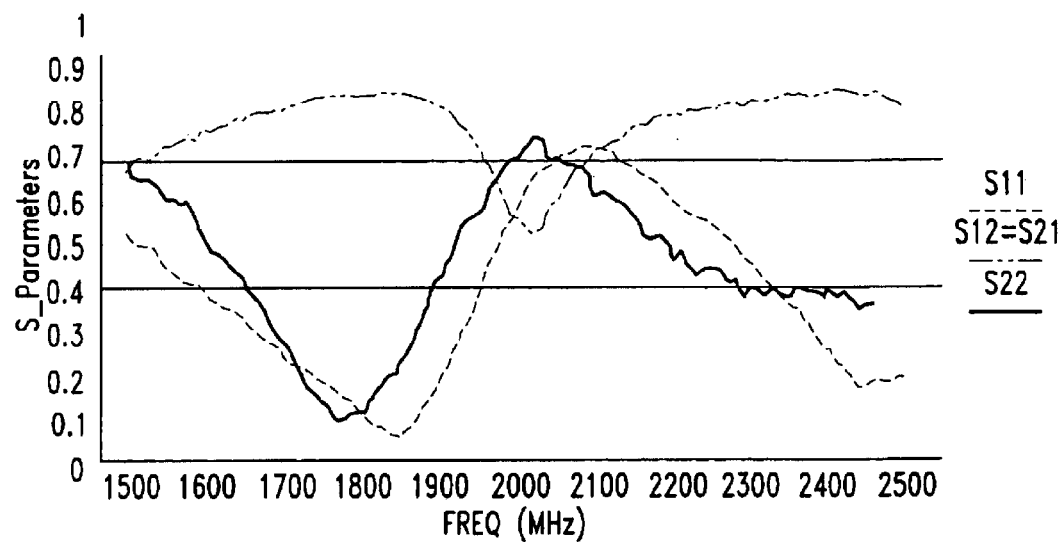
Figure 27:
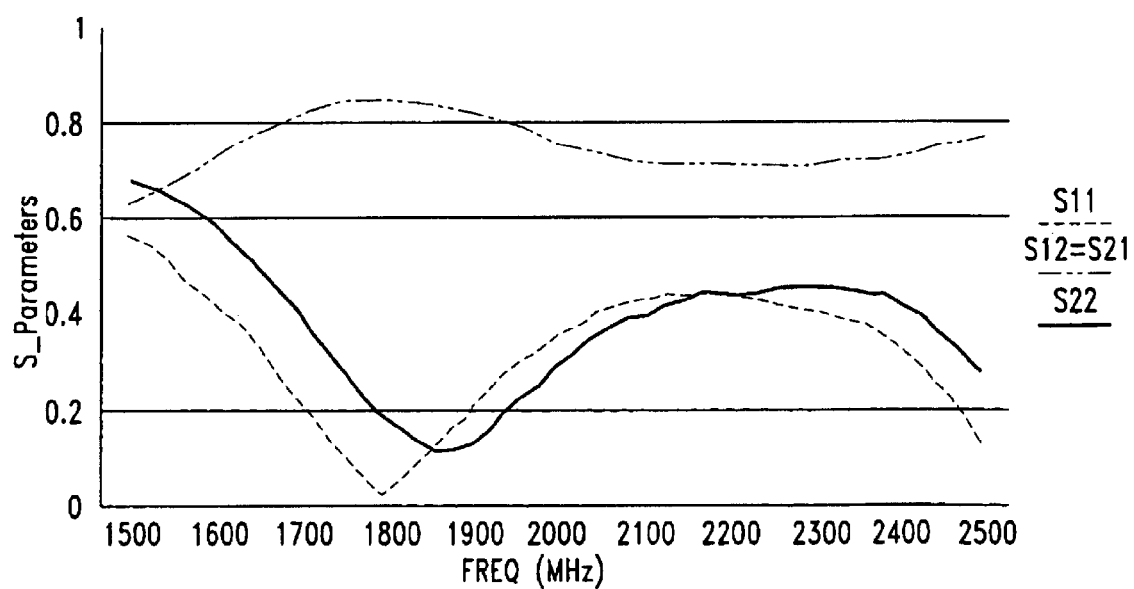
Figure 25:
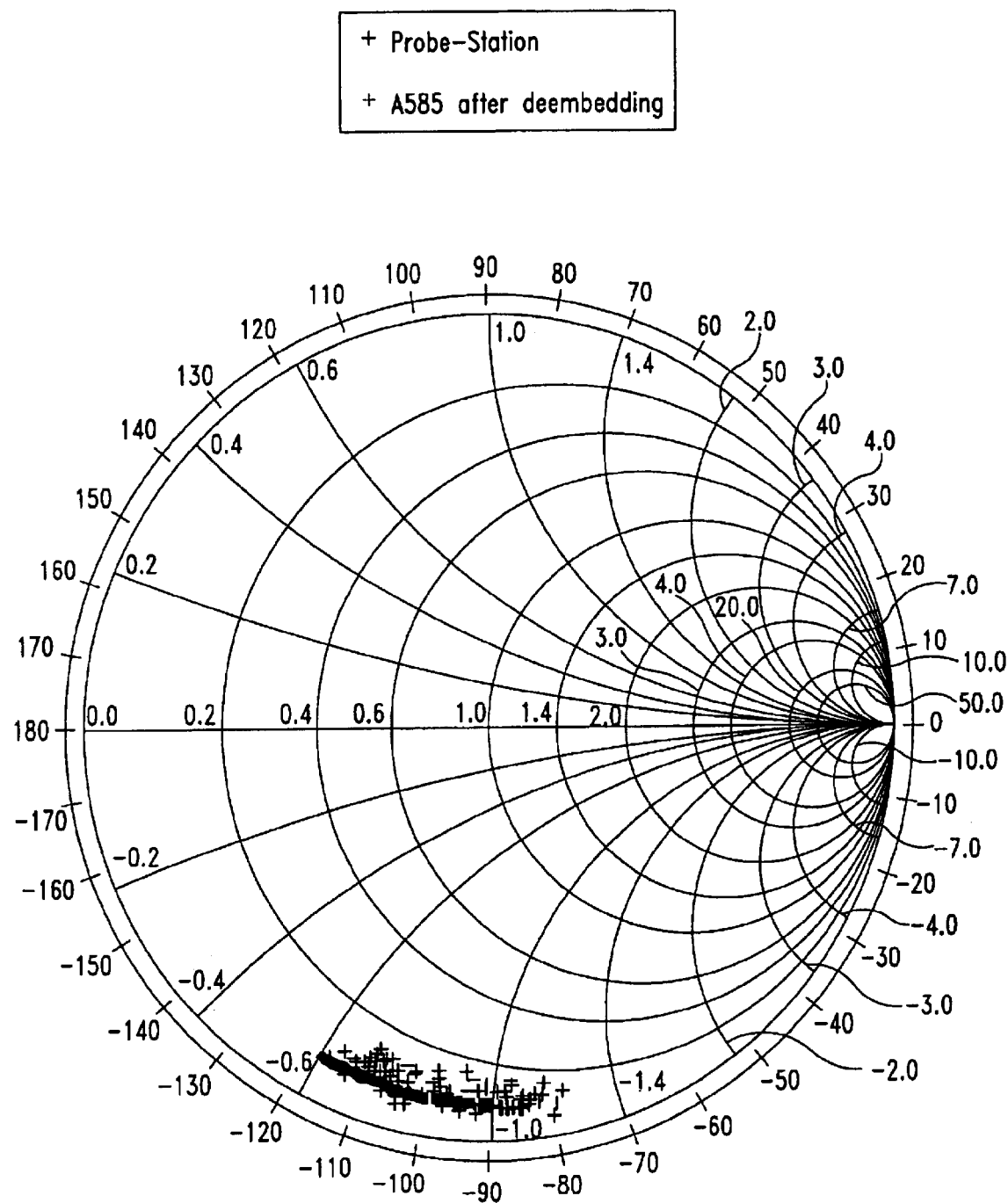
Figure 26:
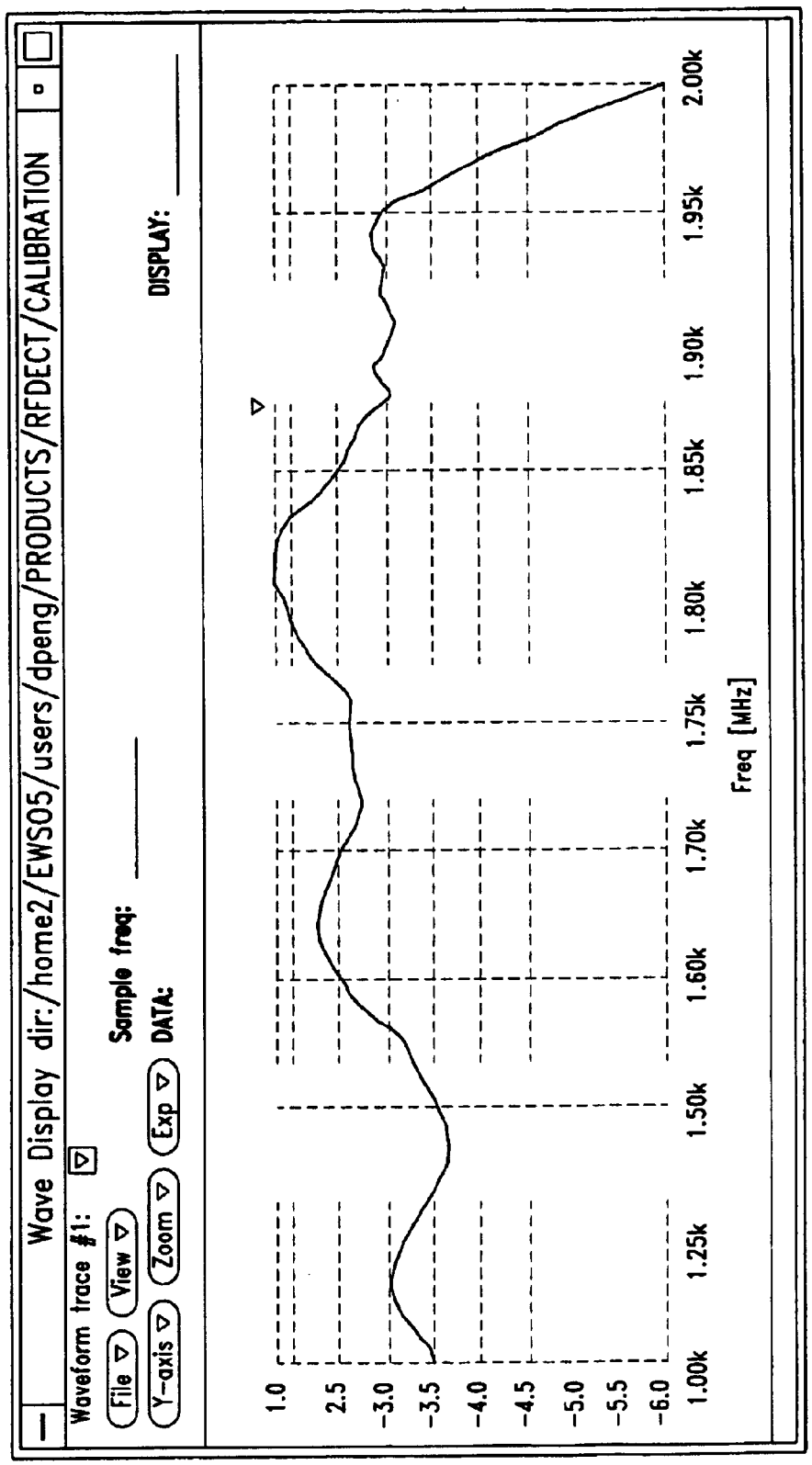
Figure 28:
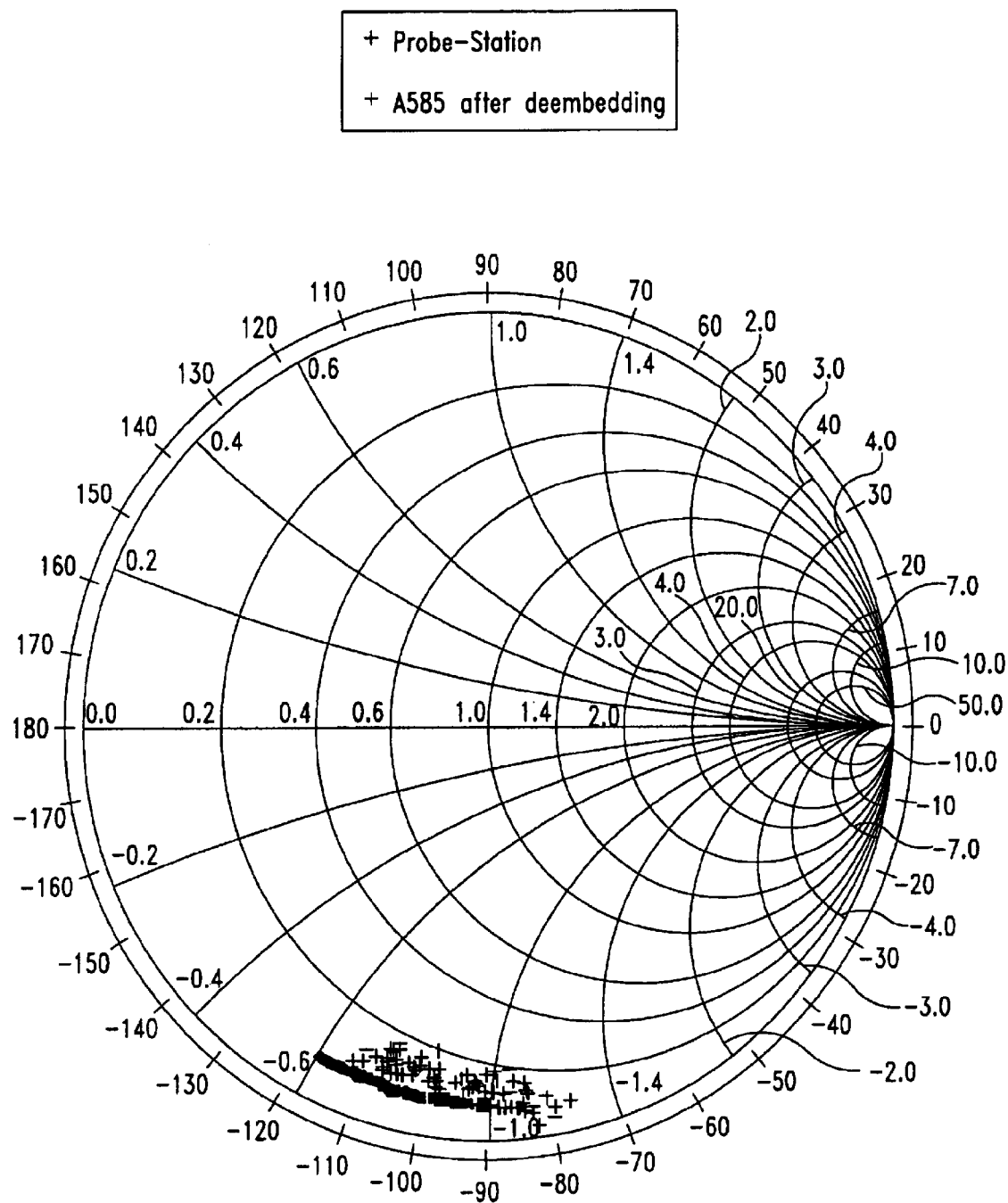
Figure 29:
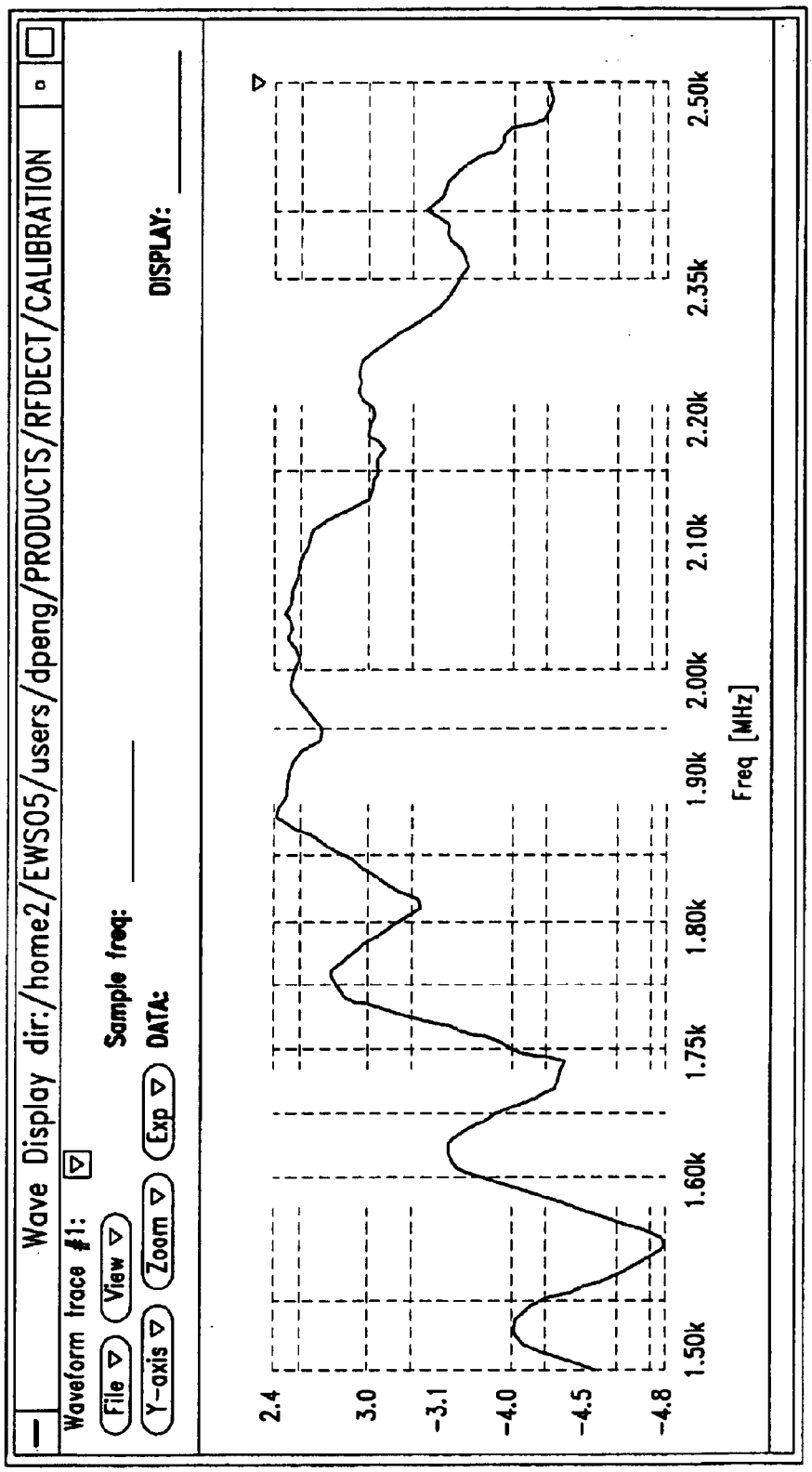

FIGS. from 10 to 16 are a series of Smith Chart schematic representations relating to a probe station with calibrated "Signal-Ground Cascade Probes" working in the frequency range from 1.5 to 2.5 GHz;

FIG. 17 shows a schematic view of the interconnections between a tester instrumentation and a Device Under Test (DUT) according to the present invention;

FIG. 18 shows a diagram reporting the result of a calibration standards set for a resistor load L1;

FIG. 19 is a Smith Chart schematic representation showing a capacitance measurements comparison relating to the probe station and the ATE after the de-embedding phase of the present invention with the resistor load L1;

FIG. 20 reports a diagram showing a corresponding correction factors array for the results of the FIGS. 18 and 19;

FIG. 21 shows a diagram reporting the result of a calibration standards set for a resistor load L2;

FIG. 22 is a Smith Chart schematic representation showing a capacitance measurements comparison relating to the probe station and the ATE after the de-embedding phase of the present invention with the resistor load L2;

FIG. 23 reports a diagram showing a corresponding correction factors array for the results of the FIGS. 21 and 22;

FIG. 24 shows a diagram reporting the result of a calibration standards set for a resistor load L3;

FIG. 25 is a Smith Chart schematic representation showing a capacitance measurements comparison relating to the probe station and the ATE after the de-embedding phase of the present invention with the resistor load L3;

FIG. 26 reports a diagram showing a corresponding correction factors array for the results of the FIGS. 24 and 25;

FIG. 27 shows a diagram reporting the result of a calibration standards set for a resistor load L4;

FIG. 28 is a Smith Chart schematic representation showing a capacitance measurements comparison relating to the probe station and the ATE after the de-embedding phase of the present invention with the resistor load L4;

FIG. 29 reports a diagram showing a corresponding correction factors array for the results of the FIGS. 27 and 28.

DETAILED DESCRIPTION OF THE INVENTION

Referring to the drawing figures, generally shown at 1 an automatic test equipment (ATE) according to an embodiment of the invention.

The inventive method is used to calibrate an Automatic Test Equipment (ATE) and to deembed the test boards at the wafer level. As previously noted, we will also refer hereinafter to the ATE with the brief appellation of "tester".

The inventive method comprises two main steps or phases. A first step is the calibration of the automatic test equipment till the configuration plane.

Some OSL calibration standards are used to perform this method step.

A second step is a test board de-embedding in order to extend the calibration plane from the configuration board to the wafer pads.

A specific set of calibration standards provided on the device under test is used to perform this second method step. These calibration standards have been characterized just for that purpose.

The de-embedding information that come out from the inventive method are used to adjust the measured RF signal levels.

The measurements have been performed on a RF transceiver. In order to calibrate the tester till the Configuration-board plane, some OSL calibration standards have been provided, as explained in the following lines.

Then, the tester boards have been de-embedded, to extend the calibration plane from the configuration board to the wafer pads, using a set of said calibration standards on wafer specifically provided for this purpose. The de-embedding information that come out from this method are used to adjust the mixer conversion gain and the output power level measurements of the RF tester.

The inventive method has been implemented on an Automatic Test Equipment (ATE) including a RF instrumentation, for instance an ATE known as Teradyne A585.

According to one embodiment of the invention the tester calibration and de-embedding method improves the RF measurements accuracy on the automatic testing equipment for the IC wafers. The method steps are the following:

1. Tester automatic calibration
   Up to the Internal Plane;
   Automatically invoked by the system;
2. Calibration plane transfer
   Up to the Configuration-Board Plane;
   Using coaxial OSL standards;
3. Test Boards De-embedding
   Up to the Wafer dice Plane;
   Using specially made Calibration Standards on wafer.

Figure 3:
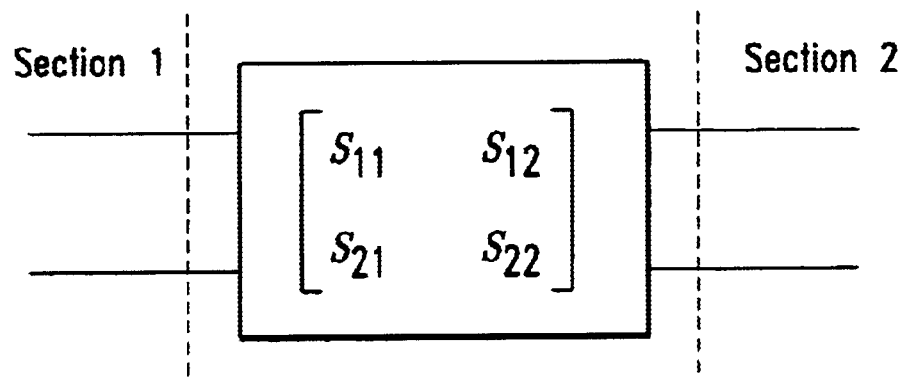
FIG. 3 shows a schematic view of a passive network including complex S parameters to define a reciprocal transmission line.

We will now evaluate the tester calibration phase up to the configuration board plane and with reference to FIG. 3.

Generally speaking, the invention allows to apply the S-parameters theory for de-embedding phase with the probe-card needles.

If we consider that a two port passive network can be characterized by four complex parameters matrix, for example an S-parameters matrix, we may take in consideration the passive network shown in FIG. 3.

If we assume that such a network is a passive and reciprocal transmission line of this kind:

$$S_{12}=S_{21}$$

then the above complex parameters become three.

Figure 4:
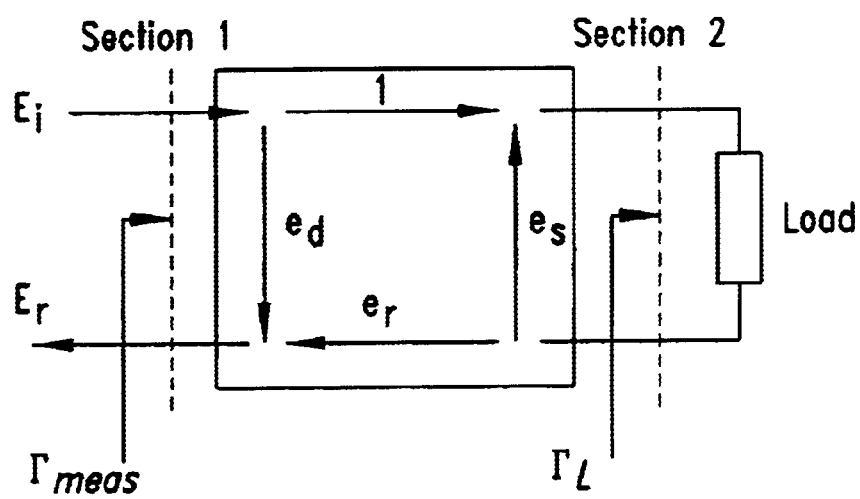
FIG. 4 shows a schematic view of the passive and reciprocal network of FIG. 3 using simplified three-term parameters.

According to this setting, it is possible to use a "Three-Term Error Adaptor" shown in FIG. 4 in order to transfer the calibration plane from the section 1 of FIG. 3 to section 2 of the same FIG. 3.

In FIG. 4 a passive and reciprocal network is shown, where:

$$\Gamma_{meas} = Er/Ei = e_d + (e_r \cdot \Gamma_L)/(1 - e_s \cdot \Gamma_L)$$

and $e_d = S_{11}$ $e_s = S_{22}$ $e_r = S_{12} \cdot S_{21}$

To calculate the unknown variables $e_d$, $e_s$ and $e_r$ we need three independent equations, that's three different known loads.

Usually the three loads used are Open circuit, Short circuit and a 50 Ohm load. For this reason this kind of calibration is called OSL (Open, Short, Load).

As reported above, the tester is able to perform an automatic calibration up to an internal plane. This operation can be done because the presence, inside the uwport (microwave port), of a "calibration module" and some switches that allow the system to connect internal Open, Short and Load and provide a reflection measurements.

Figure 5:
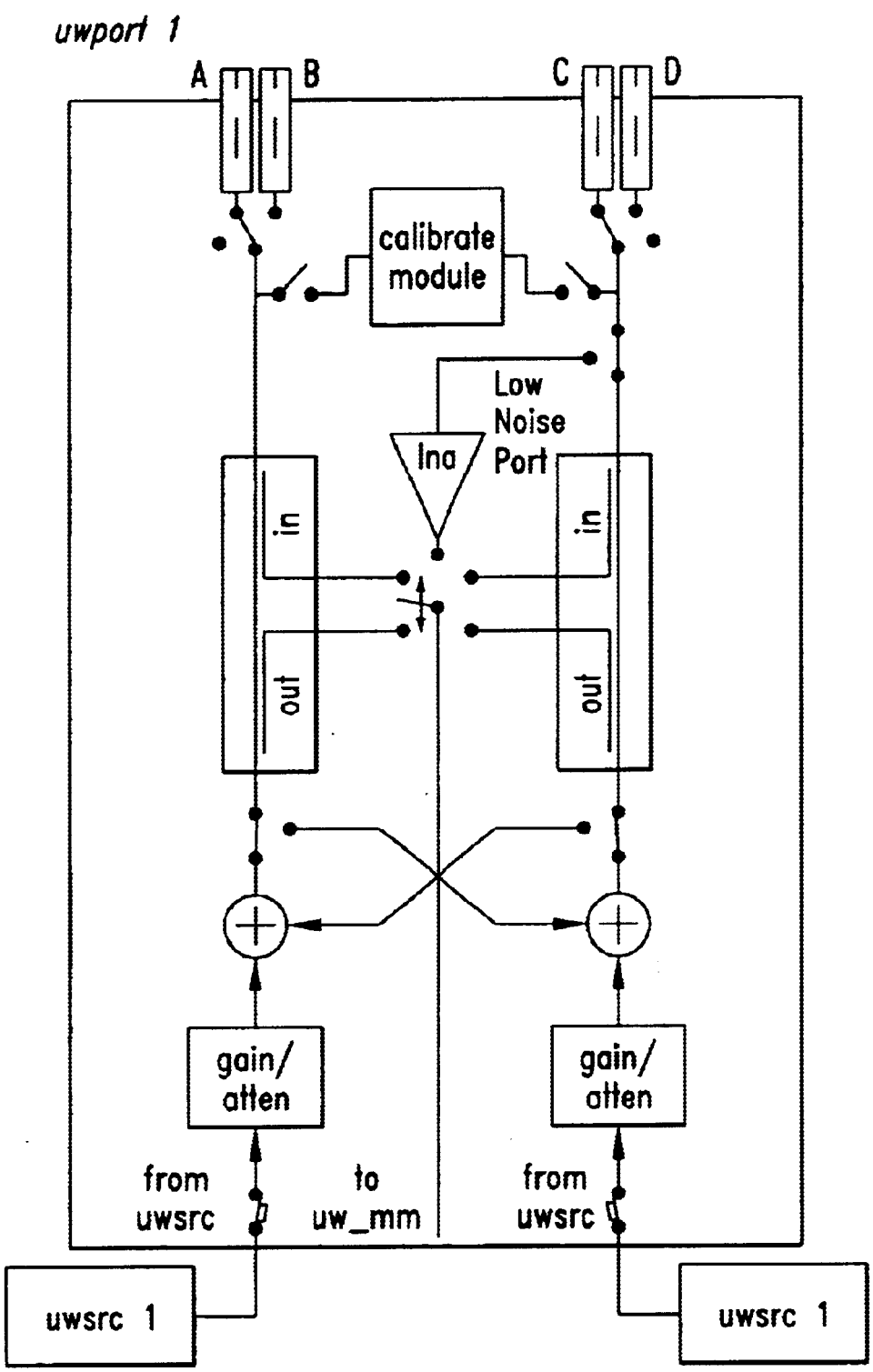
FIG. 5 is a schematic block diagram of a micro-wave port incorporated into a known tester of a standard calibration system for IC wafer testing.
Figure 6:
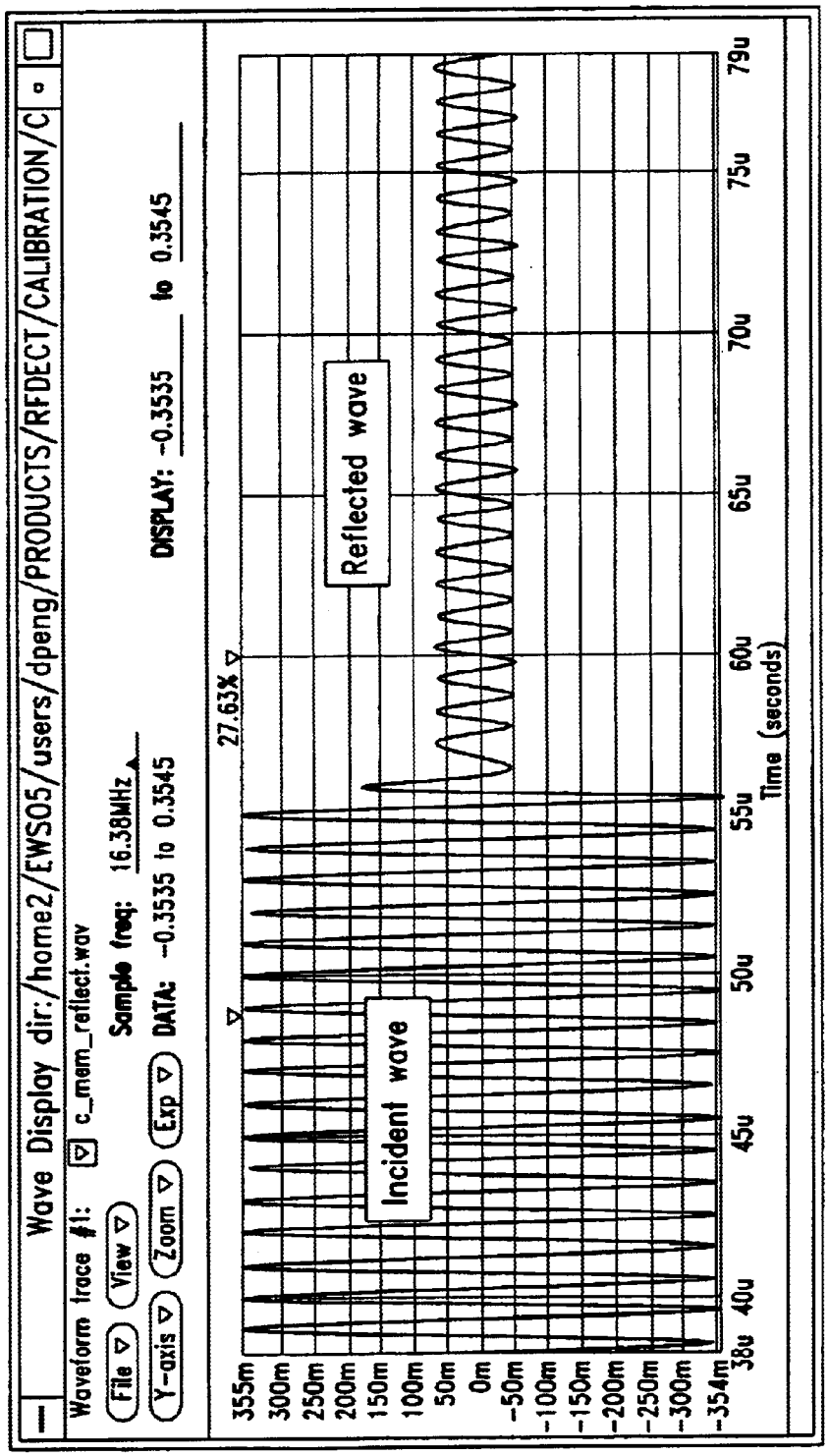
FIG. 6 shows the waveform of a reflected microwave as compared to an incident wave.

FIG. 5 is a schematic block diagram of a micro-wave port incorporated into a known tester of a standard calibration system for IC wafer testing and FIG. 6 shows the waveform of a reflected microwave as compared to an incident wave.

Figure 1:
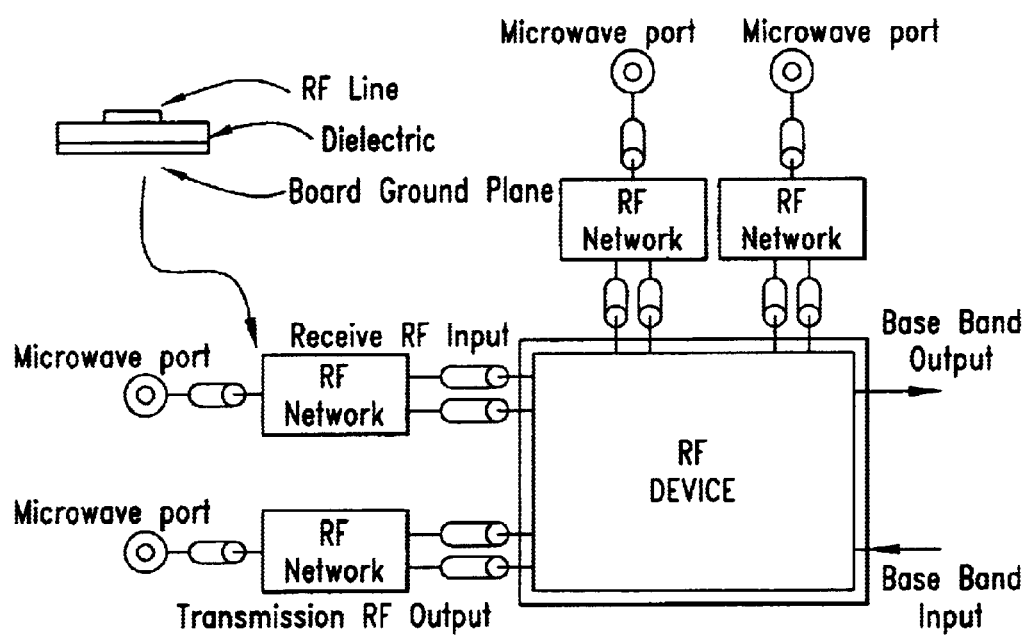
FIG. 1 shows a block diagram of a conventional test board instrumentation for an Automatic Test Equipment (ATE)
Figure 2:
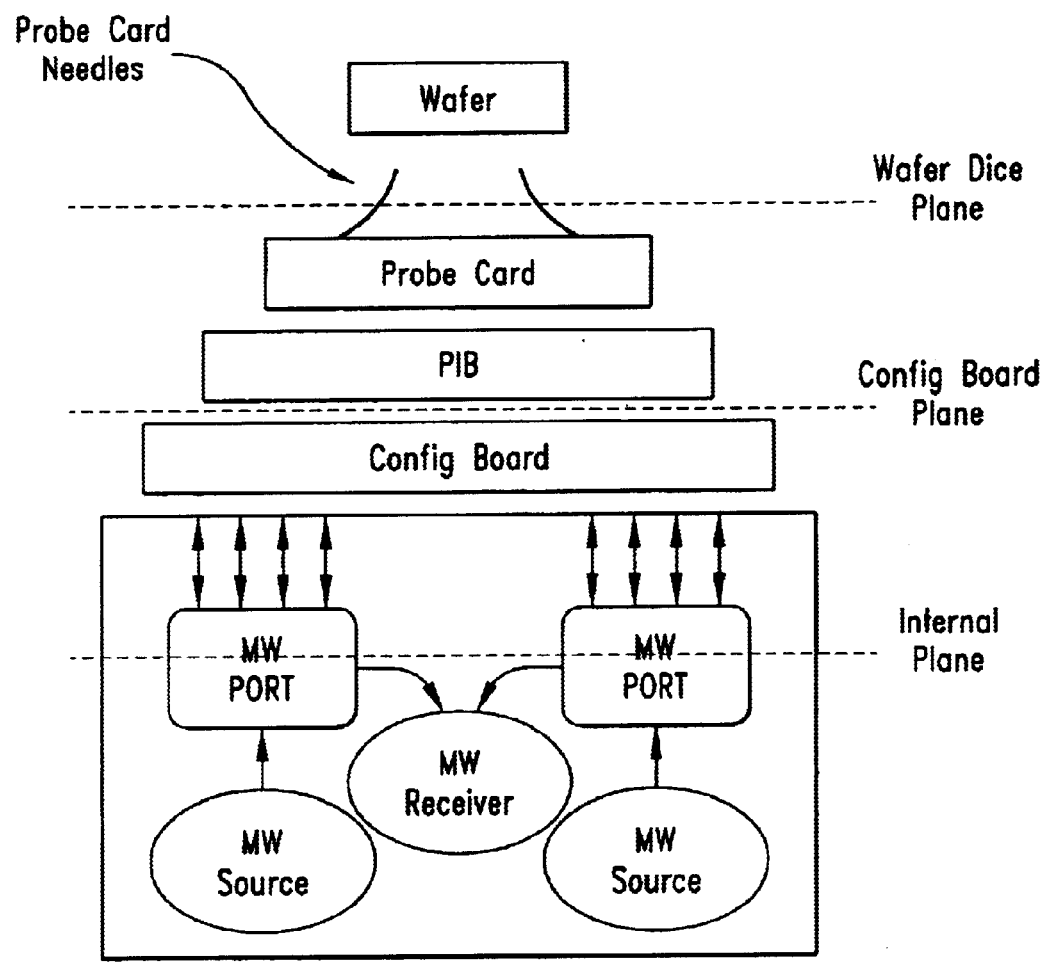
FIG. 2 shows a schematic view of the interconnections between a tester instrumentation and a Device Under Test (DUT) according to the prior art.

In order to transfer the calibration plane from the Internal to the Configuration-board plane, as shown in FIG. 2, the invention suggests to use three external OSP standard loads, which may be defined by the tester supplier.

In the case of the above mentioned Teradyne A585 tester, this transfer is executed by running an Image Progen function known as a command routine: "Transfer_External_Calibration", here is the algorithm list:

call Transfer_External_Calibration Frequencies: Incremental_Sweep

| | |
|---|---|
| Start_Freq = | 1.5 GHz |
| Stop_Freq = | 2.5 GHz |
| Step = | 10 Mhz |
| Power_Level = | −25.0 dBm |
| Measure_Delta = | 9 |
| Averages = | 2 |
| Method: | One_Port |
| Pin = | RF_IN |
| Std_file_open = | "open.s1p" |
| Std_file_short = | "short.s1p" |
| Std_file_load = | "load.s1p" |
| Int_Std_file_open = | "internal_open.s1p" |
| Int_Std_file_short = | "internal_short.s1p" |
| Int_Std_file_load = | "internal_load.s1p"; |

Finally, after the transfer step, the calibration becomes active by running an Image Progen function known as a command routine: "Calibration_S_Parameters_Internal", here is the algorithm list:

call Calibrate_S_Parameters_Internal Frequencies: Incremental_Sweep

| | |
|---|---|
| Start_Freq = | 1.5 GHz |
| Stop_Freq = | 2.5 GHz |
| Step = | 10 MHz |
| Power_Level = | −25.0 dBm |
| Measure_Delta = | 9 |
| Averages = | 2 |
| Method: | One_Port |
| Pin = | RF_IN |
| Int_Std_file_open = | "internal_open.s1p" |
| Int_Std_file_short = | "internal_short.s1p" |
| Int_Std_file_load = | "internal_load.s1p"; |

Now, we will consider the inventive method for designing the standards and the de-embedding procedure using such standards.

As a first approach, we have to consider the method used to generate the S-Parameters matrix of the whole block PIB plus Probecard. According to the present invention this method involves a technique defined as OSLR (Open-Short-Load-Reciprocal).

This technique is based on the use of three calibration standard loads on wafer specifically designed for the invention purposes. These calibration standards have been designed directly using the same pad portions of the integrated device and the circuit layout has been optimized in order to have the best behavior of the loads with the minimum cost.

The Image function used and the theory, on which it is based, will be described later.

To define the wafer calibration standards according to the present invention, a standard mask set of the DUT has been used, changing only the metal levels masks and the passivation mask.

In this modified mask the pads of the RF port to be tested have been disconnected from the rest of the chip, and then connected to the calibration loads.

The whole frame includes twelve die positions, but only seven of them have been used for the calibration standards.

The following table represents the device under test frame on the wafer.

| | | L4 |
|---|---|---|
| L3 | L2 | L1 |
| C | S | O |

Figures 7A, 7B:
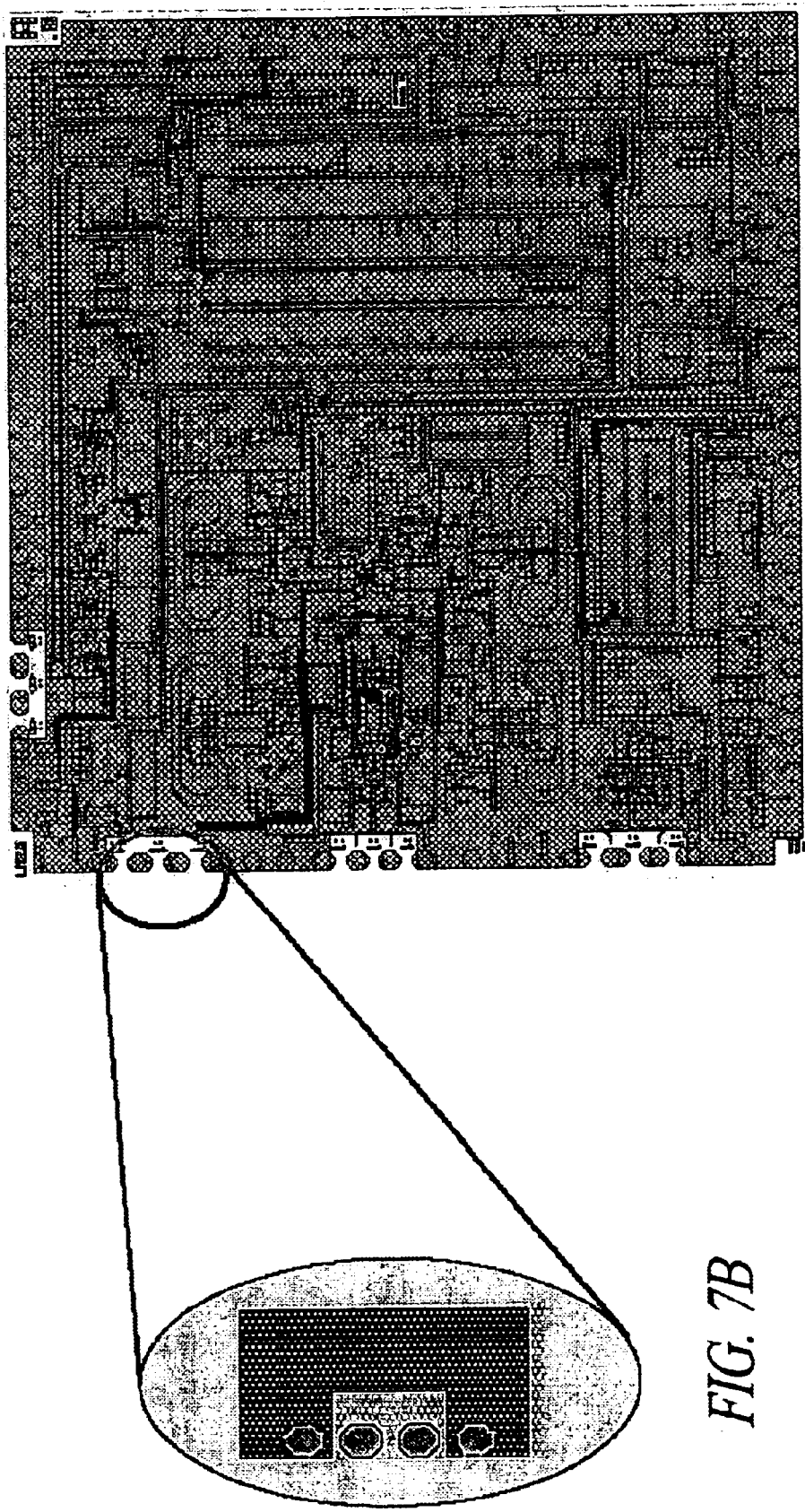
FIG. 7A is a schematic view of an Integrated Circuit having a pad terminal presenting an Open circuit as a calibration standard according to the present invention and FIG. 7B is an enlarged view of the pad terminal of FIG. 7A.
Figures 8A, 8B:
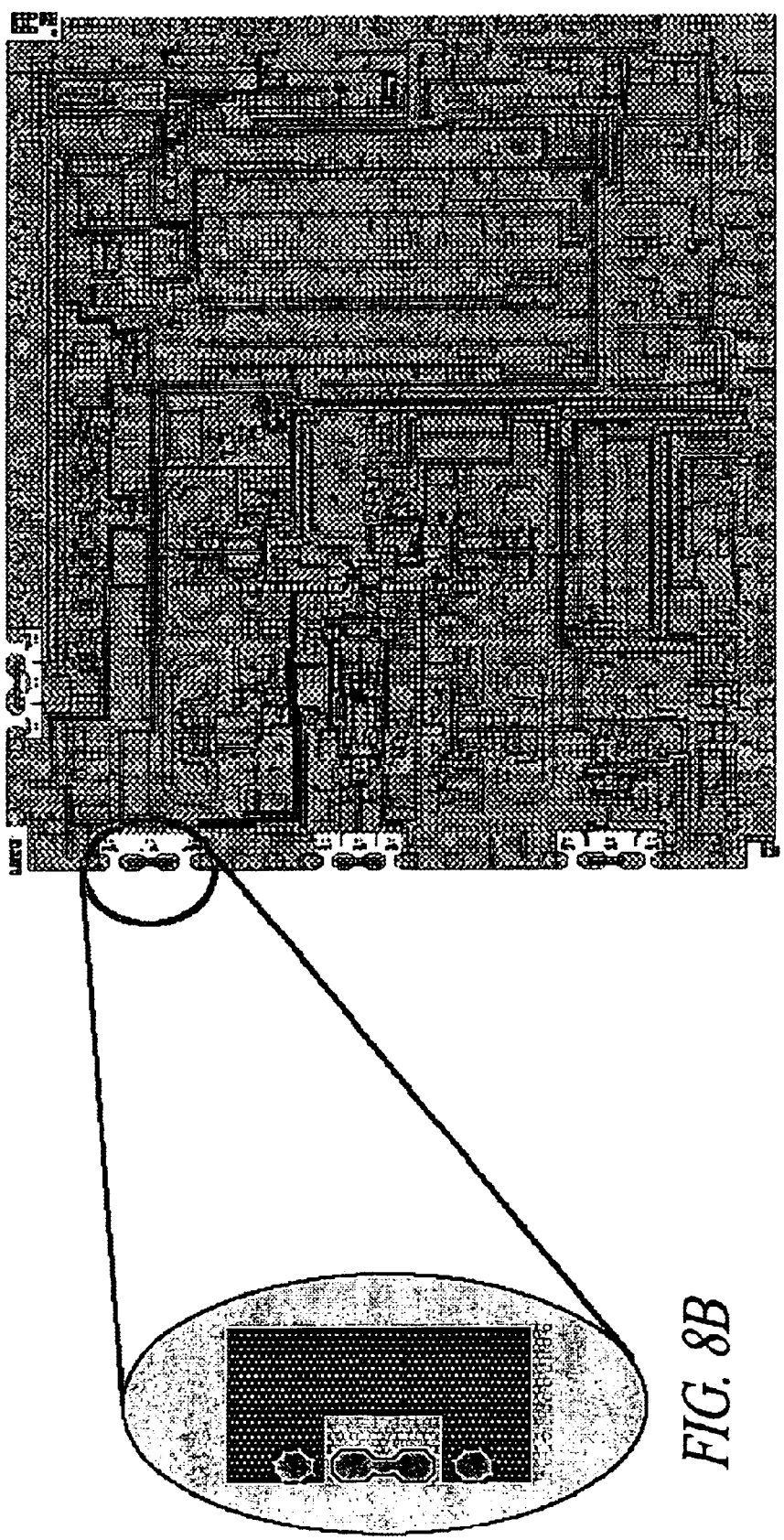
FIG. 8A is a schematic view of an Integrated Circuit having a pad terminal presenting a Short circuit as a calibration standard according to the present invention and FIG. 8B is an enlarged view of the pad terminal of FIG. 8A.
Figure 10:
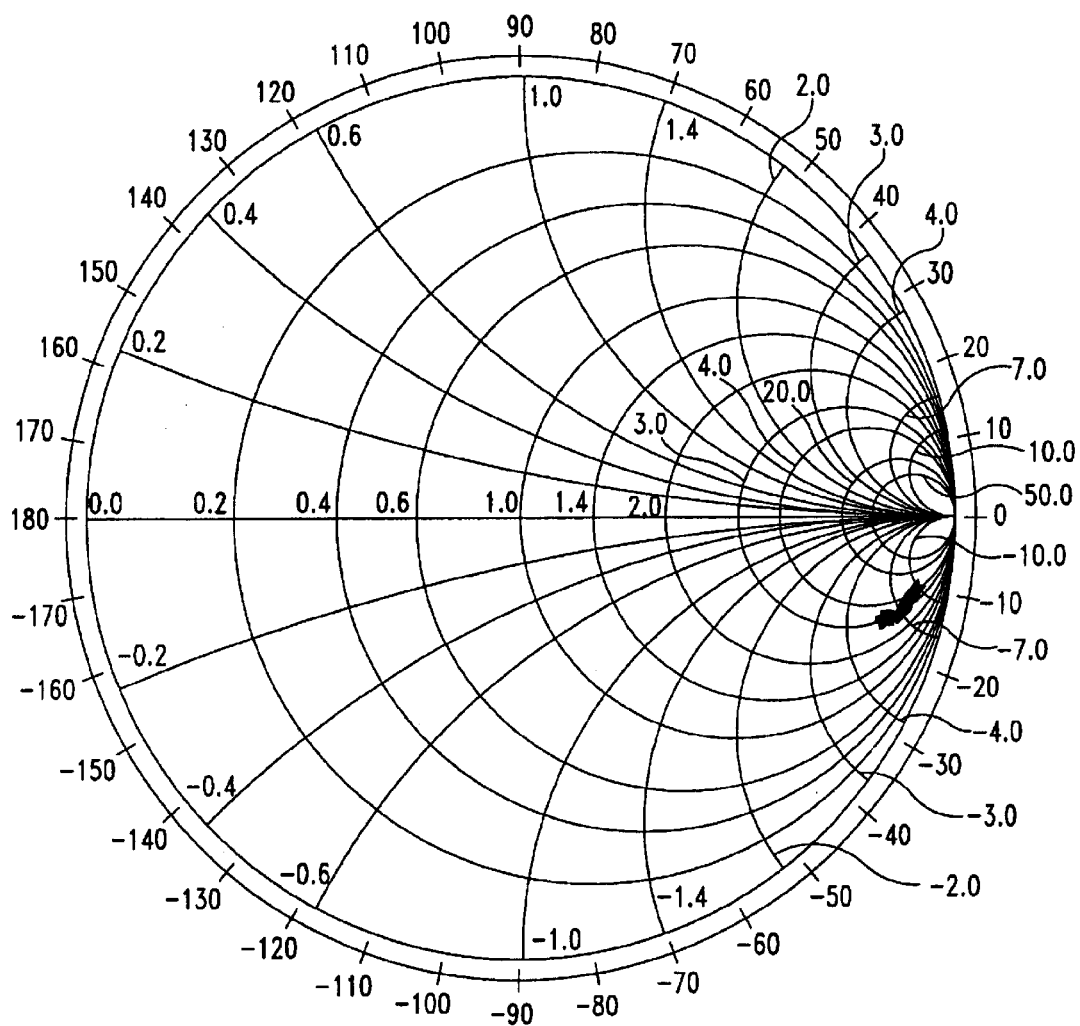
Figure 11:
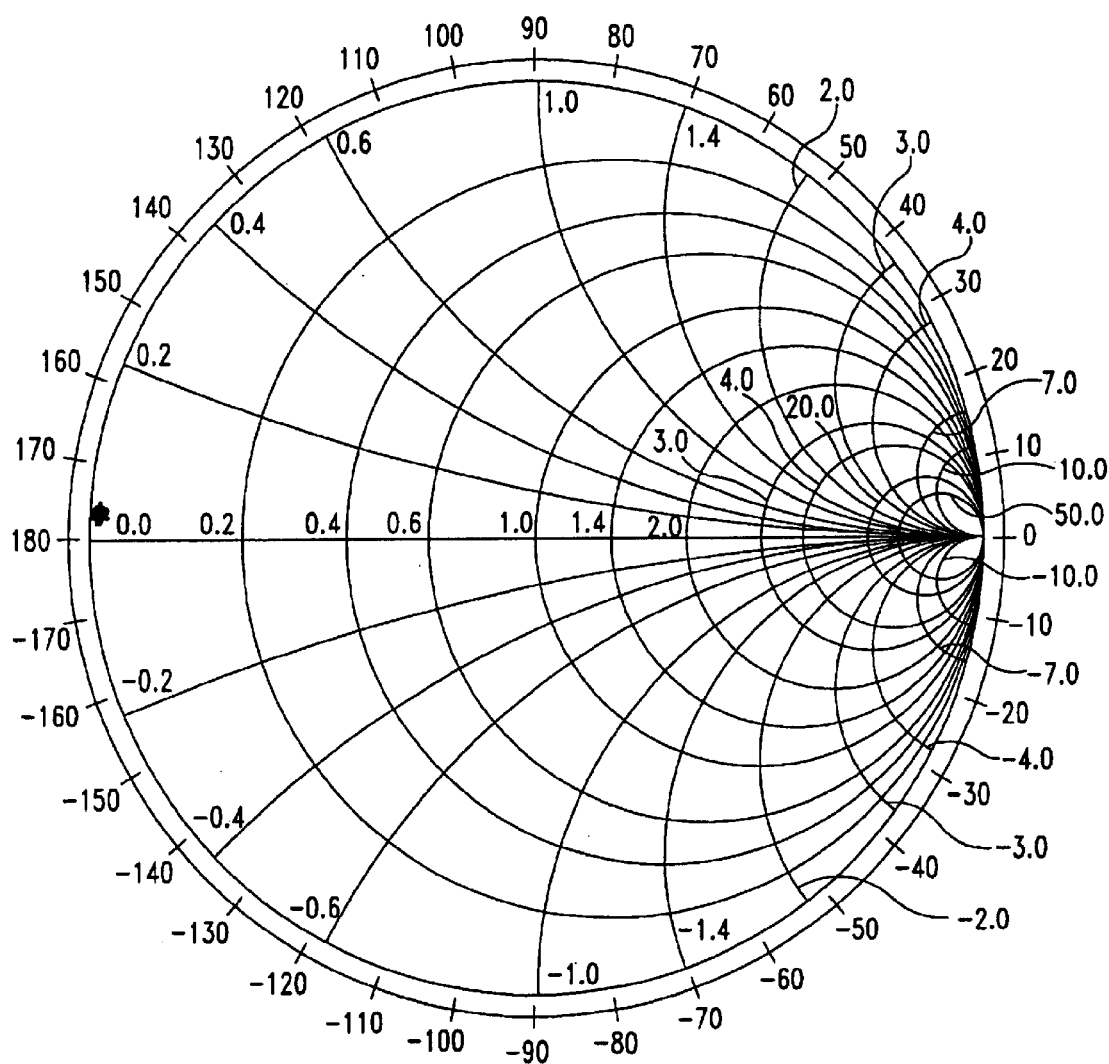
Figure 12:
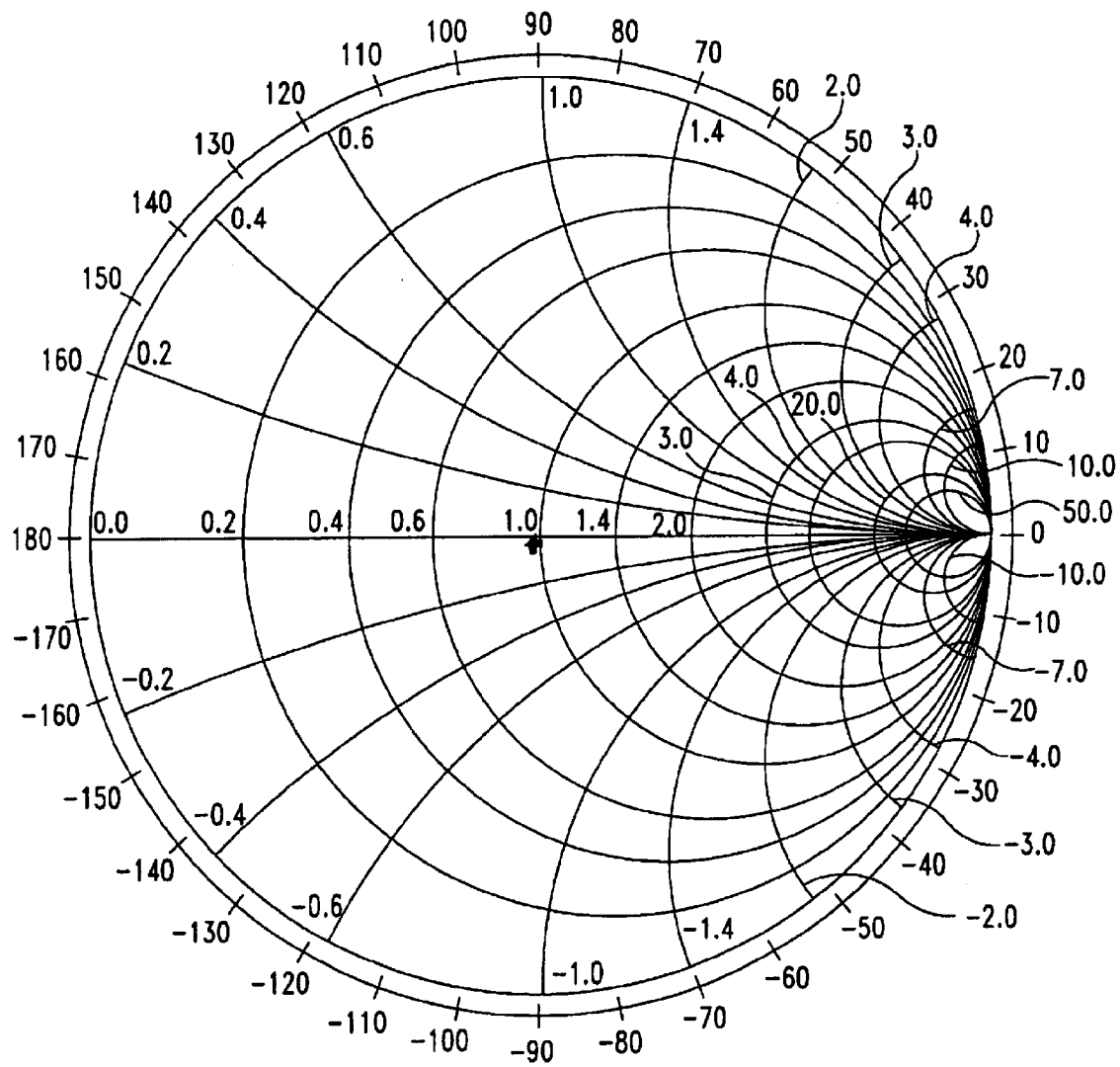
Figure 13:
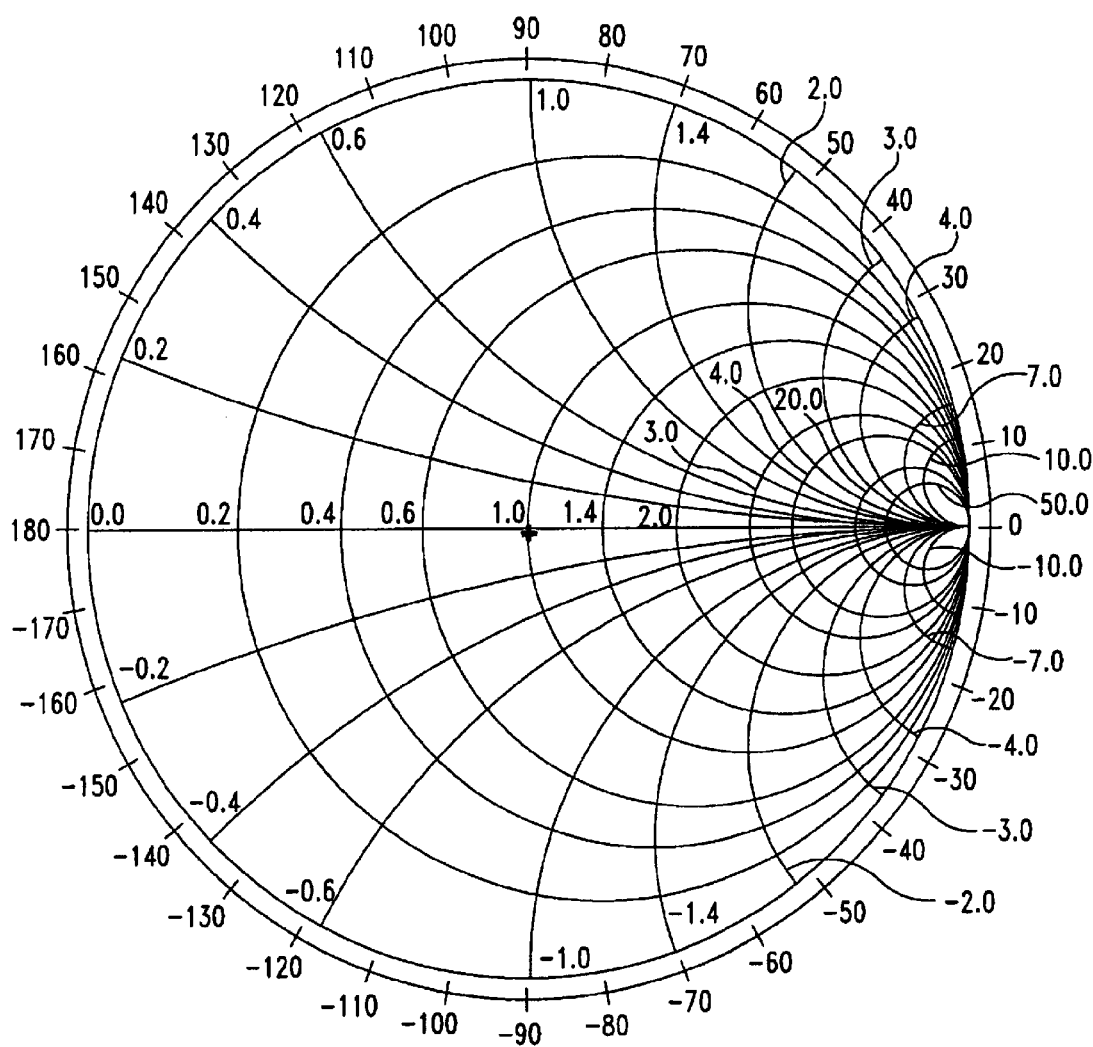
Figure 14:
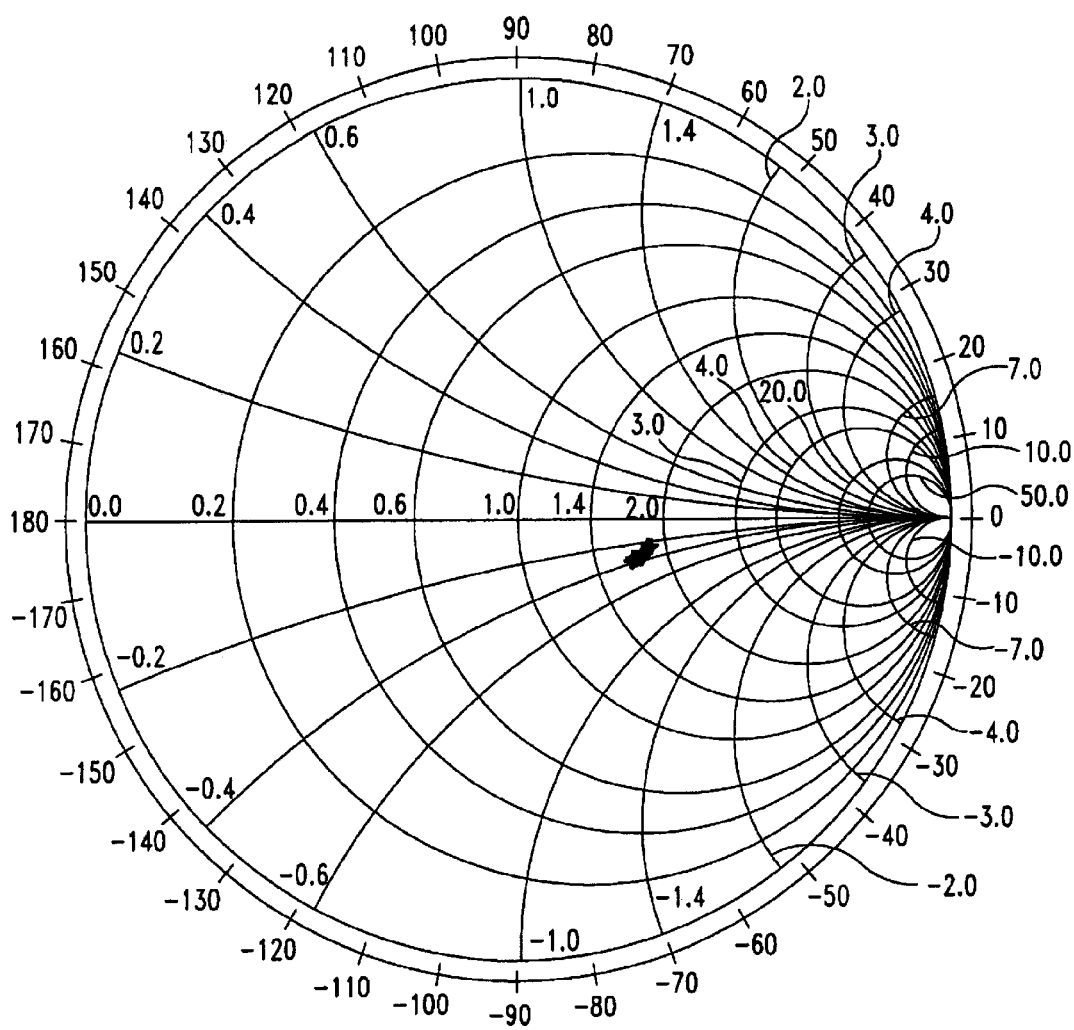
Figure 15:
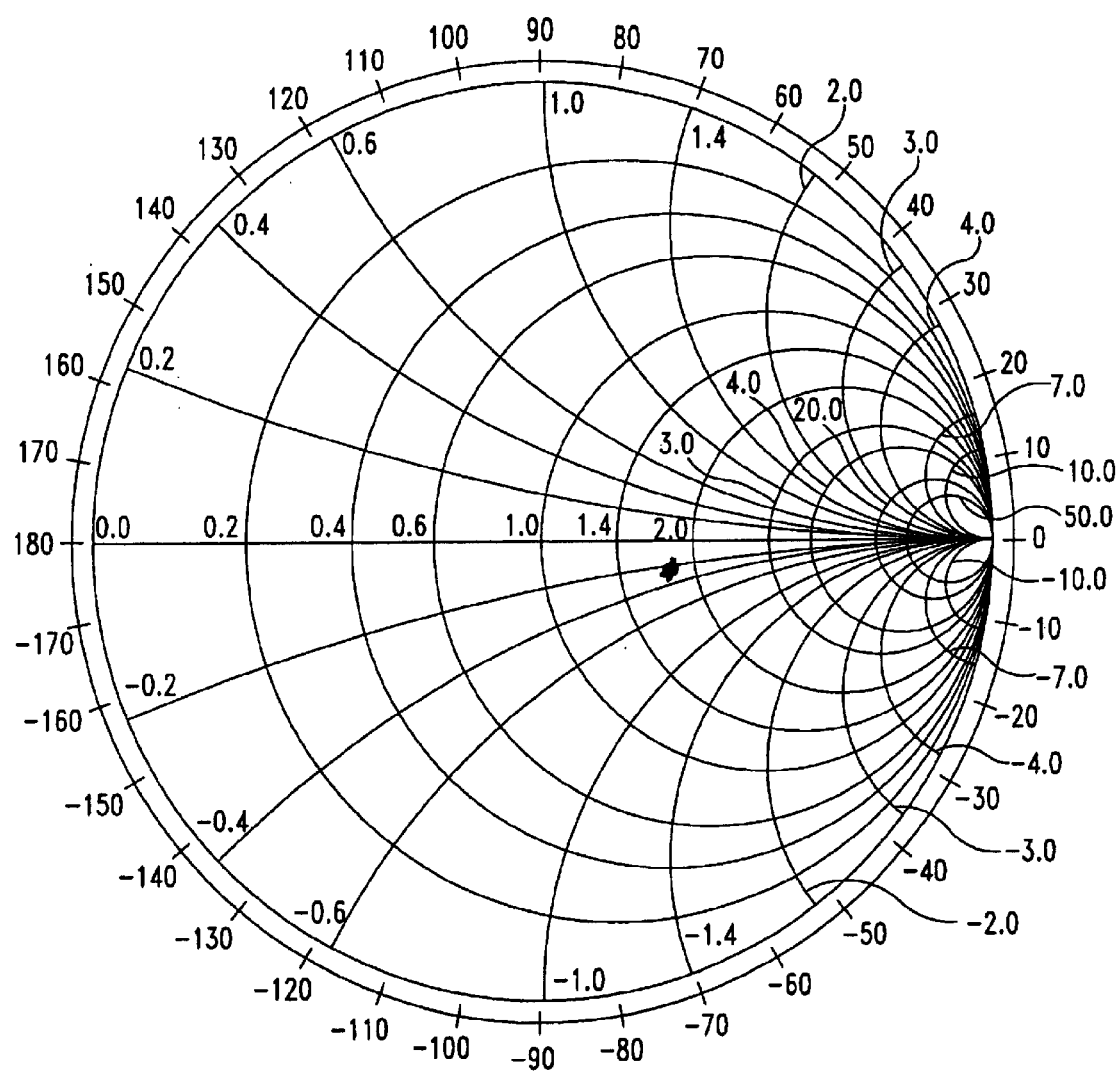
Figure 16:
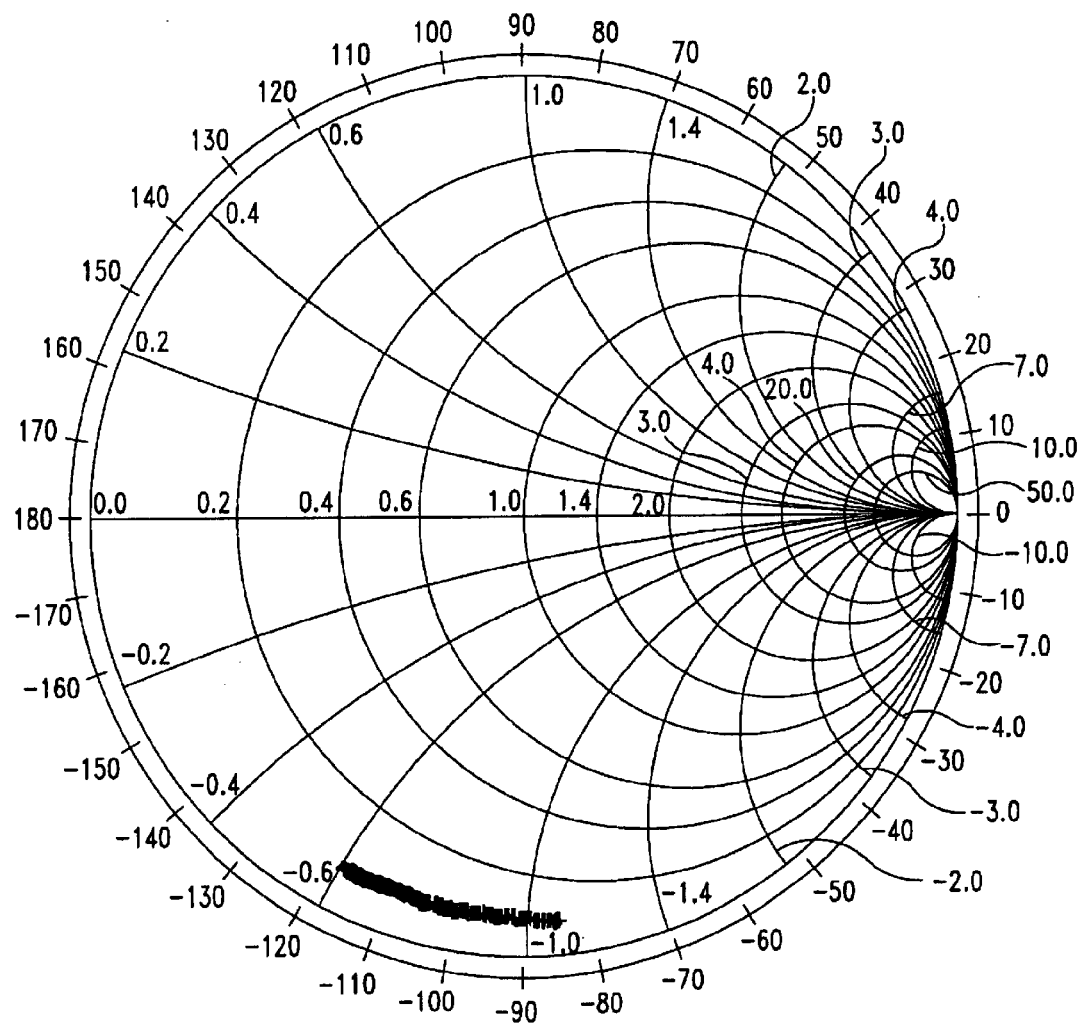

Where:

"O" is the Open between the two pads, as shown in FIG. 7;

"S" is the Short between the two pads, as shown in FIG. 8;

"L1" represent the case in which a 50 Ohm resistor load is connected between the two pads;

"L2" represent the case in which two 25 Ohm resistors loads are connected between each of the interested pads and their adjacent pad (Splitted configuration in FIG. 9;

"L3" represent the case in which the same impedances of the device are connected between the two pads of the interested port;

"L4" represent the case in which the same impedances' values of L3 are used, but in splitted configuration;

"C" is a Capacitance between the two pads, which is used to verify the correct execution of the whole calibration procedure.

All the other not interested pads of the device are shorted each other with a whole metal plane and with the device ground layer through all the device vias, as clearly shown in FIGS. 7 and 8.

This is a ground shield allowing a very good isolation from the integrated device circuits. Advantageously, this design method is independent from the integrated device type.

Before using the above calibration standards in the de-embedding procedure, they have been characterized on a probe station, in a lab, with calibrated "Signal-Ground Cascade Probes" and in the frequency range from 1.5 to 2.5 GHz.

The characterization files are shown using a series of Smith Chart representations that are shown in the pictures of the FIGS. form 10 to 16.

Let's now consider the de-embedding procedure.

The S-Parameter matrix of FIG. 3, that characterizes the whole block PIB plus Probecard, is generated by running an Image Progen function known as a command routine: "Create_Deembed_File_OSLR" in the above mentioned ATE Terayne A585, here is the algorithm list:

call Create_Deembed_File_OSLR Frequencies: Incremental_Sweep

| | |
|---|---|
| Start_Freq = | 1.5 GHz |
| Stop_Freq = | 2.5 Ghz |
| Step = | 10 MHz |
| Power_Level = | −25.0 dBm |
| Measure_Delta = | 9 |
| Averages = | 2 |
| Method: | One_Port |
| Pin = | RF_IN |
| Std_file_open = | "op.s1p" |
| Std_file_short = | "sh.s1p" |
| Std_file_load = | "l1.s1p" |
| Deembed_File = | deemb_on_wafer.s2p |

The inputs to this function are the three sip files that characterize the wafer standard loads (Open, Short and Load). After the three measurement steps of these loads a s2p file (the de-embedding file) is created.

This s2p file can be accepted as input by an Image Progen function known as a command routine: "Measure_S_Parameters", which is used to measure the S11 parameter at one port, here is the corresponding algorithm list:

call Measure_S_Parameter Frequencies: Incremental_Sweep

| | |
|---|---|
| Start_Freq = | 1.5 GHz |
| Stop_Freq = | 2.5 GHz |
| Step = | 10 MHz |
| Power_Level = | −25.0 dBm |
| Measure_Delta = | 9 |
| Averages = | 2 |
| Method: | One_Port |
| Pin = | RF_IN |
| Deembed_File = | deemb_on_wafer.s2p |
| One_Port_File = | Capacitance_gamma.s1p |

In this way the inventive method allows to verify the test-boards de-embedding, see for instance the example of FIG. 17, measuring the fourth calibration load the corresponding capacitance has been designed on the wafer.

The comparison between the measurements after the de-embedding and the characterization, done on the probe station, is shown in the following lines.

The last step of the whole work is to apply all the previous procedure to the DUT normal test.

When a RF signal from the device is measured or sourced to the port pads, normally some power losses due to the mismatching between tester equipment and device occur. These losses are related to power reflection at that port and then become known once the S11 parameter of the device, at that section, is measured. Using the Image Progen function "Measure_S-Parameters", it is possible to measure the S11 parameter, and then the scalar correction factor is evaluated by a function "Level_Adjust".

Here are the corresponding algorithms:

call Measure_S_Parameter Frequencies: Incremental_Sweep

| | |
|---|---|
| Start_Freq = | 1.5 GHz |
| Stop_Freq = | 2.5 GHz |
| Step = | 10 MHz |
| Power_Level = | −25.0 dBm |
| Measure_Delta = | 9 |
| Averages = | 2 |
| Method: | One_Port |
| Pin = | RF_IN |
| Deembed_File = | deemb_on_wafer.s2p |
| One_Port_File = | dut_gamma.s1p |
| Es_File = | es_file.s1p |
| call Level_Adjust | |
| Correction: | Source |
| Source_Match: | File |
| SM_File = | es_file.s1p |
| Technique: | Transducer_Gain |
| Dut_input_gamma = | "dut_gamma.s1p" |
| Deembed_File = | deemb_on_wafer.s2p |
| Num_Freqs = | 101 |
| Correction_Array = | correction_factors_array |

The correction factors' values are shown, among the results, hereinafter.

The following table reports a verification capacitance measure comparison between the probe-station and the tester, and the correction factor array, in the frequency range from 1.5 to 2.5 GHz.

These results are shown with reference to the interesting RF port and the de-embedding file.

Moreover, the results are shown in the Figures for each of the four calibration standards sets, which differ each other for the resistor load (L1, L2, L3 and L4). The table below summarizes the comparison between the final correction factors, at one frequency, found using our procedure and the usual correlation with the bench measurements.

| L1 | L2 | L3 | L4 | BENCH |
|---|---|---|---|---|
| 2.4 dB | 2.4 dB | 2.9 dB | 3.0 dB | 3.2 dB |

The FIG. 18 shows a diagram reporting the result of a calibration standards set for the resistor load L1 while the FIG. 19 is a Smith Chart schematic representation showing a capacitance measurements comparison relating to the probe station and the ATE after the de-embedding phase of the present invention with the load standard L1.

FIG. 20 reports a diagram showing a correction factors array.

The other Figures show the same results for the other loads: L2, L3 and L4 respectively.

The main important result of the inventive method is that the de-embedding phase of the test board block, PIB plus Probecard, is possible using wafer calibration standards, specifically designed for this purpose.

The design methodology for the standards is well working and it is applicable to every kind of device and technology.

The achievements are confirmed by two results:
1. The verification using the capacitance (FIGS. 19, 22, 25, 28) shows a very good approximation between the probe-station and the ATE measurements.
2. The final correction factors calculated after de-embedding, using the disclosed procedure, confirm the values estimated by the usual correlation between the measurements on bench and on the ATE.

In particular, the calibration sets with the loads L3 and L4 give the best performances.

Furthermore, no relevant differences between the results obtained using the calibration set, with splitted and unsplitted configuration, have been observed.

Therefore, a calibration standard set, with a single load between the two pads can be used also for differential ports. It must be noted that between the L1/L2 and L3/L4 load sets it has been that the best approximation is achieved by using the L3 or L4 set. This means that, generally, it is recommended to design the calibration standard loads as near as possible to the device impedance at that port, in order to minimize the unwanted mismatching reflections and get the best measure accuracy.

Another important achievement is that the disclosed design methodology allows obtaining calibration standards on wafer, using the same diffusion process as the device under testing. In this way we can get two main advantages:
1. The modification of only a minimized set of masks is required
2. Low cost technique.

Moreover the use of calibration standards on wafer reduces drastically the cycle-time for the correction factors evaluation to:

$$T<1 \text{ day}$$

and so, the inventive method is very useful in the production environment too.

The method according to the present invention obtain many advantages with respect to the prior art solutions and namely:
it allows obtaining absolute values for the RF measurements on wafer using an ATE;
it allows obtaining the ATE measurements independent from the bench measurements;
it avoids the operation of correlation with the bench;
low cost calibration standards are obtained on the wafer since the same diffusion process used to manufacture the device under test is implemented for the standards too; just a minimum set of marks are modified for this purpose.

What is claimed is:

1. A test board de-embedding method to improve RF measurements accuracy on an automatic testing equipment for IC wafers, wherein each wafer includes a device under test located on a wafer die plane and being contacted by probecard needles of a probecard that is coupled to a configuration board through a probe interface board, the method including the following phases:
performing an automatic calibration phase of said testing equipment up to an internal plane inside said automatic testing equipment;
performing a calibration plane transfer up to a plane of said configuration board;
performing a test boards de-embedding phase up to the wafer die plane.

2. The method according to claim 1, wherein said calibration plane transfer is performed by using a predetermined number of calibration standard loads on said wafer.

3. The method according to claim 1, wherein said calibration plane transfer is performed by using at least three calibration standard loads on said wafer.

4. The method according to claim 2, wherein said calibration standard loads are coaxial OSL (Open, Short, Load) standards.

5. The method according to claim 2, wherein said test boards de-embedding phase is performed using the same calibration standards realized on said wafer.

6. The method according to claim 2, said calibration standards have been realized directly using the pad portions of the integrated device realized on said wafer.

7. The method according to claim 2, wherein said used loads are: Open circuit, Short circuit and a 50 Ohm load, thus forming OSL (Open, Short, Load) calibration standards.

8. The method according to claim 2, wherein said calibration standards are defined on said wafer providing specific metal levels masks and a passivation mask for the device under test.

9. The method according to claim 1, wherein said probecard and said probe interface board depend on the device under test.

10. A method to improve RF measurements accuracy on an automatic testing equipment for IC wafers by implementing a test board de-embedding phase, wherein each wafer includes a device under test located on a wafer die plane and being contacted by probecard needles of a probecard that is coupled to a configuration board through a probe interface board, the method including the following phases:
performing an automatic calibration phase of said testing equipment up to an internal plane located inside said automatic testing equipment;
performing a calibration plane transfer up to a plane of said configuration board using a predetermined number of calibration standard loads realized on said wafer;
performing a test boards de-embedding phase up to the wafer die plane.

11. The method according to claim 10, wherein said calibration standard loads on said wafer are at least three.

12. The method according to claim 10, wherein said calibration standard loads are coaxial OSL (Open, Short, Load) standards.

13. The method according to claim 10, wherein said test boards de-embedding phase is performed using the same calibration standards realized on said wafer.

14. The method according to claim 10, said calibration standards have been realized directly using the pad portions of the integrated device realized on said wafer.

15. The method according to claim 10, wherein said loads used are: Open circuit, Short circuit and a 50 Ohm load, thus forming OSL (Open, Short, Load) calibration standards.

16. The method according to claim 10, wherein said calibration standards are defined on said wafer providing specific metal levels masks and a passivation mask for the device under test.

17. The method according to claim 10, wherein said probecard and said probe interface board depend on the device under test.

18. A method to improve RF measurements accuracy on an automatic testing equipment for IC wafers including at least a device or circuit under test located on a wafer die plane, the wafer being contacted by probecard needles of a probecard that is coupled to a configuration board of said equipment through a probe interface board, the method including the following phases:
performing a calibration phase of said testing equipment up to an internal plane located inside said automatic testing equipment;

performing a calibration plane transfer up to a plane of said configuration board using a predetermined number of calibration standard loads realized on said wafer;

performing a test boards de-embedding phase up to the wafer die plane.

19. The method according to claim 18, wherein at least three calibration standard loads on said wafer are used for said calibration plane transfer.

20. The method according to claim 18, wherein said calibration standard loads are coaxial OSL (Open, Short, Load) standards.

21. The method according to claim 18, wherein said test boards de-embedding phase is performed using the same calibration standards realized on said wafer.

22. The method according to claim 18, said calibration standards have been realized directly using the pad portions of the integrated device realized on said wafer.

23. The method according to claim 18, wherein said used loads are: Open circuit, Short circuit and a 50 Ohm load, thus forming OSL (Open, Short, Load) calibration standards.

24. The method according to claim 18, wherein said calibration standards are defined on said wafer providing specific metal levels masks and a passivation mask for the device under test.

25. The method according to claim 18, wherein said probecard and said probe interface board depend on the device under test.

* * * * *